United States Patent
Seo et al.

(10) Patent No.: US 11,398,535 B2
(45) Date of Patent: Jul. 26, 2022

(54) ELECTROLUMINESCENT DISPLAY DEVICE WITH BANK BETWEEN SAME COLOR SUB-PIXELS

(71) Applicant: LG Display Co., Ltd, Seoul (KR)

(72) Inventors: Hwang-Un Seo, Paju-si (KR); Sun-Hoe Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 213 days.

(21) Appl. No.: 16/706,127

(22) Filed: Dec. 6, 2019

(65) Prior Publication Data
US 2020/0194520 A1 Jun. 18, 2020

(30) Foreign Application Priority Data
Dec. 13, 2018 (KR) .......................... 10-2018-0161095

(51) Int. Cl.
*H01L 27/32* (2006.01)

(52) U.S. Cl.
CPC ...... *H01L 27/3246* (2013.01); *H01L 27/3218* (2013.01)

(58) Field of Classification Search
CPC .......................... H01L 27/3246; H01L 27/3218
See application file for complete search history.

(56) References Cited

U.S. PATENT DOCUMENTS

| | | | | |
|---|---|---|---|---|
| 2016/0329388 A1* | 11/2016 | Yokota | ............... | H01L 27/3246 |
| 2019/0221623 A1* | 7/2019 | Kamiyama | ......... | H01L 51/0021 |
| 2021/0134894 A1* | 5/2021 | Peng | ...................... | H01L 51/56 |

FOREIGN PATENT DOCUMENTS

| CN | 104659064 A | * | 5/2015 | |
|---|---|---|---|---|
| CN | 204332961 U | * | 5/2015 | |
| CN | 104681594 A | * | 6/2015 | ........... G02F 1/1362 |
| CN | 106920828 A | * | 7/2017 | ............. H01L 51/56 |
| CN | 107731871 A | * | 2/2018 | ......... H01L 27/3246 |
| CN | 108598140 A | * | 9/2018 | |
| CN | 109148547 A | * | 1/2019 | ......... H01L 27/3211 |
| JP | 2015141402 A | * | 8/2015 | ......... H01L 27/3213 |
| KR | 10-2015-0106622 A | | 9/2015 | |
| KR | 20170003844 A | * | 1/2017 | ......... H01L 27/3218 |

* cited by examiner

*Primary Examiner* — Peter Bradford
(74) *Attorney, Agent, or Firm* — Birch, Stewart, Kolasch & Birch, LLP

(57) ABSTRACT

An electroluminescent display device includes first, second, third and fourth pixels arranged in a matrix form along a first direction and a second direction, each of the first, second, third and fourth pixels including first, second and third sub-pixels; a light-emitting diode disposed at each of the first, second and third sub-pixels and including a first electrode, a light-emitting layer and a second electrode, wherein the second sub-pixel is disposed between the first sub-pixel and the third sub-pixel; and a first bank is disposed between adjacent sub-pixels of a same color, and a second bank is disposed between adjacent sub-pixels of different colors, wherein the second sub-pixels of the first, second, third and fourth pixels surround the first sub-pixels of the first, second, third and fourth pixels.

11 Claims, 16 Drawing Sheets

ELECTROLUMINESCENT DISPLAY DEVICE WITH BANK BETWEEN SAME COLOR SUB-PIXELS

CROSS-REFERENCE TO RELATED APPLICATION

The present application claims priority from and the benefit under 35 U.S.C § 119(a) of Korean Patent Application No. 10-2018-0161095 filed in the Republic of Korea on Dec. 13, 2018, which is hereby incorporated by reference in its entirety.

BACKGROUND OF THE INVENTION

Field of the Disclosure

The present disclosure relates to an electroluminescent display device, and more particularly, to an electroluminescent display device having a large size and high definition.

Discussion of the Related Art

As one of flat panel display devices, an electroluminescent display device has wide viewing angles as compared with a liquid crystal display device because it is self-luminous and also has advantages of a thin thickness, light weight and low power consumption because a backlight unit is not necessary.

In addition, the electroluminescent display device is driven by low voltages of direct current (DC) and has a fast response time. Further, the electroluminescent display device is strong against the external impacts and is used in a wide range of temperatures because its components are solids, and particularly, the electroluminescent display device can be manufactured at low costs.

The electroluminescent display device includes a plurality of pixels, each of which has red, green and blue sub-pixels, and displays various color images by allowing the red, green and blue sub-pixels to selectively emit light.

The red, green and blue sub-pixels have red, green and blue light-emitting layers, respectively, and each light-emitting layer is formed through a vacuum thermal evaporation process in which a luminous material is selectively deposited using a fine metal mask.

However, the evaporation process increases manufacturing costs due to preparation of the mask and has a problem in application to a large-sized and high-definition display device due to manufacturing variations, sagging, shadow effect of the mask, and the like.

SUMMARY OF THE INVENTION

Accordingly, the present disclosure is directed to an electroluminescent display device that substantially obviates one or more of the problems due to limitations and disadvantages of the related art.

An object of the present disclosure is to provide an electroluminescent display device having a large size and high definition.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an electroluminescent display device that includes first, second, third and fourth pixels arranged in a matrix form along a first direction and a second direction, each of the first, second, third and fourth pixels including first, second and third sub-pixels; a light-emitting diode disposed at each of the first, second and third sub-pixels and including a first electrode, a light-emitting layer and a second electrode; and a first bank disposed between adjacent sub-pixels of a same color, and a second bank disposed between adjacent sub-pixels of different colors, wherein the second sub-pixel is disposed between the first sub-pixel and the third sub-pixel, wherein the second sub-pixels of the first, second, third and fourth pixels surround the first sub-pixels of the first, second, third and fourth pixels.

There is also provided an electroluminescent display device that includes a plurality of pixels arranged in a matrix form, each pixel including a plurality of sub-pixels; and a first bank pattern having a first height, and a second bank pattern having a second height, the first height being smaller than the second height, wherein the second bank is parallel in two directions, wherein the first bank pattern defines same color sub-pixels of different pixels, and wherein the second bank pattern defines different color sub-pixels of the same pixel.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate embodiments of the present disclosure and together with the description serve to explain the principles of the present disclosure. In the drawings.

DETAILED DESCRIPTION OF THE EMBODIMENTS

Reference will now be made in detail to embodiments of the disclosure, examples of which are illustrated in the accompanying drawings.

As stated above, the evaporation process has a problem in application to a large-sized and high-definition display device, and to solve the problem, a method of forming a light-emitting through a solution process has been suggested.

By the way, apparatuses used in the solution process have different implementable resolutions. As the resolution of the display device increases, the size of the pixel decreases, and an apparatus having higher resolution than the existing one is needed. Therefore, a new apparatus must be provided, and the manufacturing costs can be increased.

However, in the present disclosure, the light-emitting layer is formed using the existing solution process apparatus through arrangement of the pixels, thereby reducing the manufacturing costs.

Hereafter, an electroluminescent display device according to an embodiment of the present disclosure is described in detail with reference to the accompanying drawings.

First Embodiment

Figure 1:
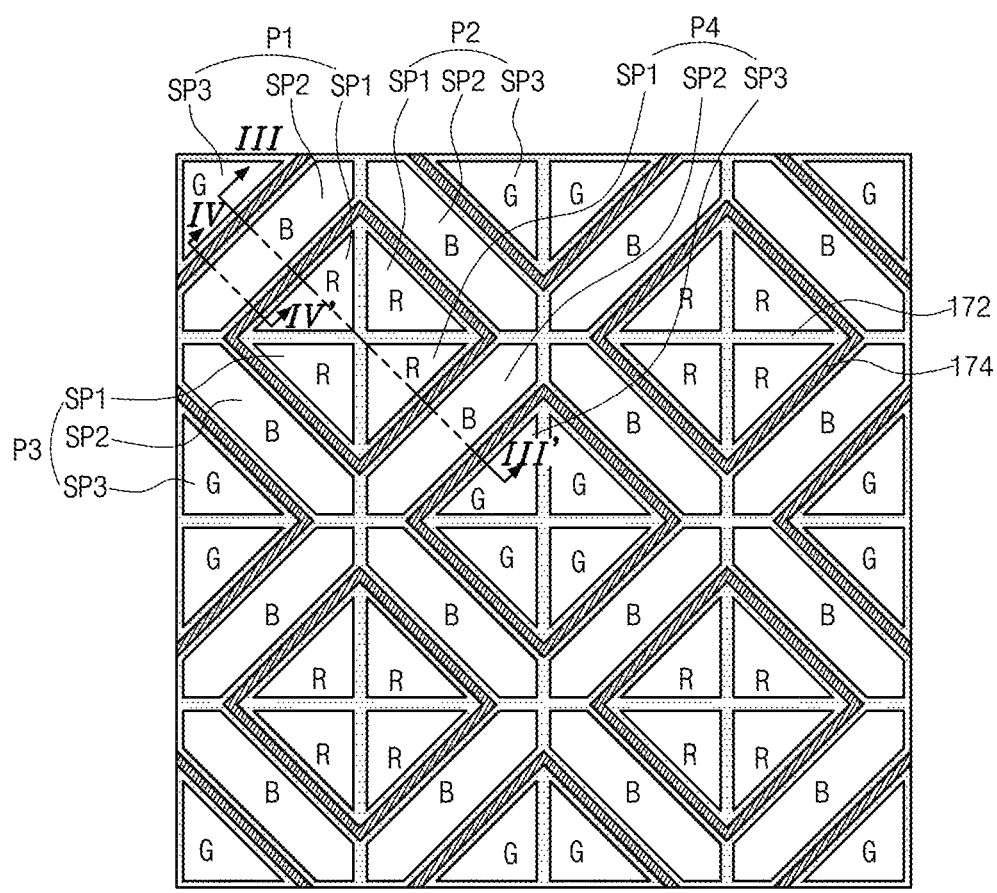
FIG. 1 is a schematic view of a pixel arrangement of an electroluminescent display device according to a first embodiment of the present disclosure.

FIG. 1 is a schematic view of a pixel arrangement of an electroluminescent display device according to a first embodiment of the present disclosure. All components of the electroluminescent display device according to all embodiments of the present disclosure are operatively coupled and configured.

In FIG. 1, first, second, third and fourth pixels P1, P2, P3 and P4 are repeatedly arranged as one unit pixel group. The first, second, third and fourth pixels P1, P2, P3 and P4 are arranged in a matrix form and are adjacent to each other along first and second directions.

More specifically, the first pixel P1 is arranged in a first column of a first row, the second pixel P2 is arranged in a second column of the first row, the third pixel P3 is arranged in the first column of a second row, and the fourth pixel P4 is arranged in the second column of the second row. Therefore, the first and second pixels P1 and P2 are arranged adjacent to each other along the first direction, and the third and fourth pixels P3 and P4 are arranged adjacent to each other along the first direction. In addition, the first and third pixels P1 and P3 are arranged adjacent to each other along the second direction, and the second and fourth pixels P2 and P4 are arranged adjacent to each other along the second direction.

Each of the first, second, third and fourth pixels P1, P2, P3 and P4 can have a square shape, but is not limited thereto. For example, each of the first, second, third and fourth pixels P1, P2, P3 and P4 can have a rectangular shape. Other geometric shapes can be used.

Each of the first, second, third and fourth pixels P1, P2, P3 and P4 includes first, second and third sub-pixels SP1, SP2 and SP3. The first, second and third sub-pixels SP1, SP2 and SP3 of each of the first, second, third and fourth pixels P1, P2, P3 and P4 are sequentially positioned along a direction crossing the first and second directions, that is, a diagonal direction. The second sub-pixel SP2 is disposed between the first and third sub-pixels SP1 and SP3.

The first and third sub-pixels SP1 and SP3 can have a triangular shape, and the second sub-pixel SP2 can have a hexagonal shape. The first, second and third sub-pixels SP1, SP2 and SP3 can have a symmetric structure with respect to a line crossing the diagonal direction and passing through the center of the second sub-pixel SP2. However, the present disclosure is not limited to this, and the first, second and third sub-pixels SP1, SP2 and SP3 can have an asymmetric structure with respect to a line passing through the center of the second sub-pixel SP2.

The first and third sub-pixels SP1 and SP3 can have the same area, and the second sub-pixel SP2 can have a larger area than each of the first and third sub-pixels SP1 and SP3. For example, the area of the second sub-pixel SP2 can be 1.2 to 1.5 times the area of each of the first and third sub-pixel SP1 and SP3. Here, the second sub-pixel SP2 can be a color sub-pixel having a shorter lifetime than the first and third sub-pixels SP1 and SP3 when the first, second and third sub-pixels SP1, SP2 and SP3 have the same area. For example, the first, second and third sub-pixels SP1, SP2 and SP3 can be red, blue and green sub-pixels, respectively. That is, the first, second and third sub-pixels SP1, SP2 and SP3 can include light-emitting layers emitting red, blue and green, respectively. However, the present disclosure is not limited to this, and the second sub-pixel SP2 can be a red or green sub-pixel.

Alternatively, the first, second and third sub-pixels SP1, SP2 and SP3 can have the same area.

In this electroluminescent display device, the first sub-pixels SP1 of the respective pixels P1, P2, P3 and P4 are arranged adjacent to each other, the second sub-pixels SP2 of the respective pixels P1, P2, P3 and P4 surround the adjacent first sub-pixels SP1, and the third sub-pixels SP3 of the respective pixels P1, P2, P3 and P4 are arranged to substantially surround the second sub-pixels SP2. In addition, the third sub-pixel SP3 of each of the respective pixels P1, P2, P3 and P4 is arranged adjacent to the third sub-pixels of other unit pixel groups adjacent to the unit pixel group.

Namely, in the electroluminescent display device according to the first embodiment of the present disclosure, four first sub-pixels SP1 are arranged adjacent to each other, four third sub-pixels SP3 are arranged adjacent to each other, and the second sub-pixels SP2 are located between the first and third sub-pixels SP1 and SP3, so that four second sub-pixels SP2 are surrounded by the four first sub-pixels SP1 or the sour third sub-pixels SP3.

The four first sub-pixels SP1 adjacent to each other and the four third sub-pixels SP3 adjacent to each other can have a rectangular shape. For example, the four first sub-pixels SP1 adjacent to each other and the four third sub-pixels SP3 adjacent to each other can have a square shape or a rhombic shape, but is not limited thereto.

In the electroluminescent display device according to the first embodiment of the present disclosure, the light-emitting layer of each of the sub-pixels SP1, SP2 and SP3 is formed through a solution process. In this case, the light-emitting layers of the four first sub-pixels SP1 adjacent to each other are formed all at once, and the light-emitting layers of the four third sub-pixels SP3 adjacent to each other are formed all at once. That is, red light-emitting layers are formed by dropping a solution together in a region corresponding to the four first sub-pixels SP1 adjacent to each other and drying the solution, so that the red light-emitting layers of the four first sub-pixels SP1 adjacent to each other are connected to each other to form one body. In addition, green light-emitting layers are formed by dropping a solution together in a region corresponding to the four third sub-pixels SP3 adjacent to each other and drying the solution, so that the green light-emitting layers of the four third sub-pixels SP3 adjacent to each other are connected to each other to form one body.

Accordingly, even if the sizes of the first and third sub-pixels SP1 and SP3 decrease, the region for dropping the solution is larger than each of the first and third sub-pixels SP1 and SP3, and thus the light-emitting layers can be formed using the existing solution process apparatus. Therefore, the manufacturing costs can be reduced.

Meanwhile, blue light-emitting layers formed in the second sub-pixels SP2 of the respective pixels P1, P2, P3 and P4 are connected to each other to form one body. The blue light-emitting layers are also connected to the blue light-emitting layers of other unit pixel group adjacent to the unit pixel group to be all connected with respect to a substantially entire surface of the display device.

The pixel arrangement according to the first embodiment of the present disclosure can be implemented by a bank structure, that is, first and second banks (or first and second bank patterns) 172 and 174. The bank structure according to the first embodiment of the present disclosure will be described with reference to FIGS. 2A and 2B.

Figure 2A:
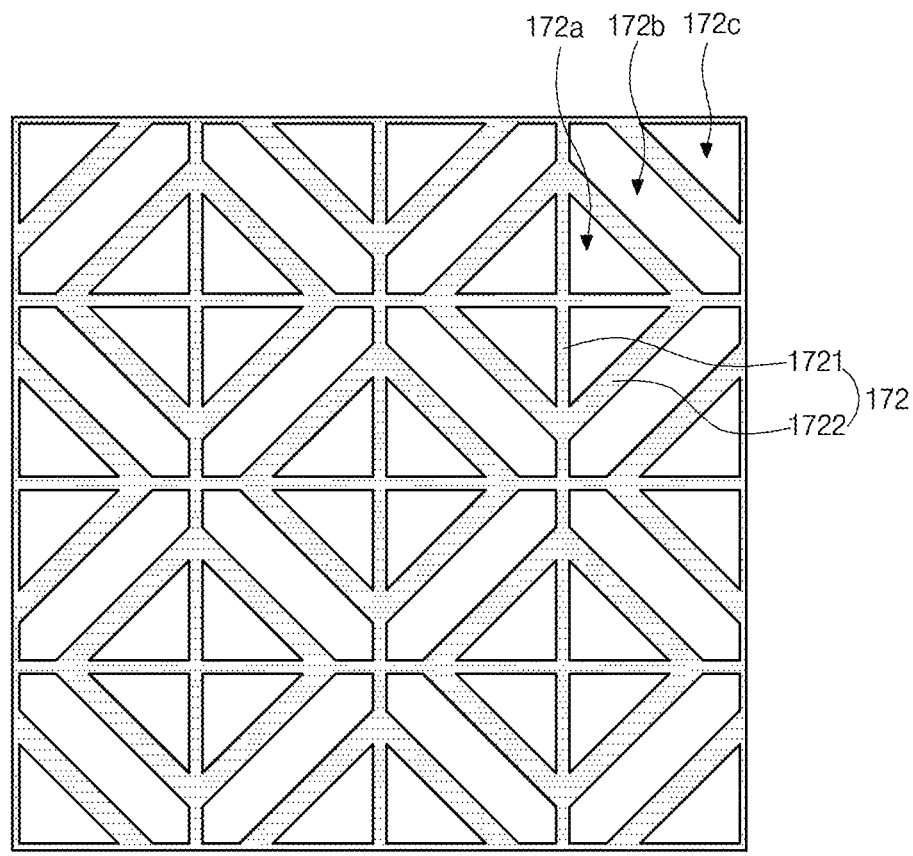
FIG. 2A is a view of schematically illustrating a first bank of the electroluminescent display device according to the first embodiment of the present disclosure.
Figure 2B:
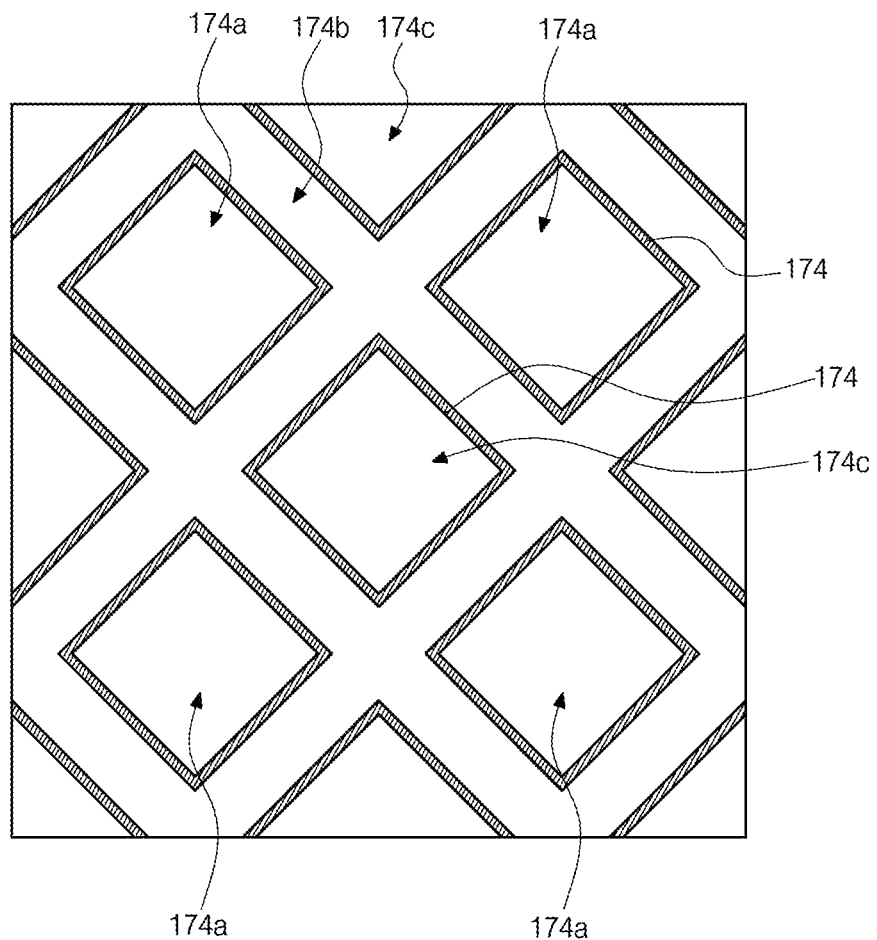
FIG. 2B is a view of schematically illustrating a second bank of the electroluminescent display device according to the first embodiment of the present disclosure.

FIG. 2A is a view of schematically illustrating a first bank of the electroluminescent display device according to the first embodiment of the present disclosure, and FIG. 2B is a view of schematically illustrating a second bank of the electroluminescent display device according to the first embodiment of the present disclosure.

In FIG. 2A, the first bank 172 according to the first embodiment of the present disclosure is formed between adjacent sub-pixels SP1, SP2 and SP3 of FIG. 1 and includes a first pattern 1721 and a second pattern 1722. The first bank 172 has a hydrophilic property.

The first pattern 1721 of the first bank 172 corresponds to a region between adjacent pixels P1, P2, P3 and P4 of FIG. 1, that is, between adjacent same color sub-pixels SP1, SP2 and SP3 of FIG. 1 and has a lattice shape along the first and second directions. In addition, the second pattern 1722 corresponds to a region between adjacent different color sub-pixels SP1, SP2 and SP3 of FIG. 1 and has a rectangular shape.

The first bank 172 has first, second and third holes 172a, 172b and 172c corresponding to the first, second and third sub-pixels SP1, SP2 and SP3 of FIG. 1, respectively.

Here, a width of the second pattern 1722 is shown to be larger than a width of the first pattern 1721, but is not limited thereto. The first pattern 1721 and the second pattern 1722 can have the same width, or the width of the first pattern 1721 can be larger than the width of the second pattern 1722. Based on the first pattern 1721 and the second pattern 1722, the first bank 172 or portions thereof can be parallel in multiple directions, such as at least two directions. As shown in FIG. 2A, the first pattern 1721 or portions thereof can extend in two directions such as vertical and horizontal directions, while the second pattern 1722 or portions thereof can extend in two directions such as diagonal directions. Portions of the first pattern 1721 and the second pattern 1722 can intersect. The first bank 172 or portions thereof can extend in at least four directions thereby. The first pattern 1721 can be thinner than the second pattern 1722, or vice-versa, but such is not required, and the first pattern 1721 can be the same thickness as the second pattern 1722.

Next, as shown in FIG. 2B, the second bank 174 according to the first embodiment of the present disclosure corresponds to a region between adjacent different color sub-pixels SP1, SP2 and SP3 of FIG. 1 and has a rectangular shape. That is, the second bank 174 is formed to correspond to the second pattern 1722 of the first bank 172. At this time, it is beneficial that a width of the second bank 174 is smaller than the width of the second pattern 1722 of the first bank 172. For example, the second bank 174 can have a rhombic shape, but is not limited thereto. Based the second bank 174 or portions thereof can be parallel in multiple directions, such as at least two directions. As shown in FIG. 2B, the second bank 174 or portions thereof can extend in two directions such as diagonal directions.

The second bank 174 has a hydrophobic property.

Moreover, the second bank 174 has first, second and third openings 174a, 174b and 174c corresponding to the first, second and third sub-pixels SP1, SP2 and SP3 of FIG. 1, respectively. Namely, the first opening 174a corresponds to the four first sub-pixels SP1 of FIG. 1 adjacent to each other, the third opening 174c corresponds to the four third sub-pixels SP3 of FIG. 1 adjacent to each other, and the second opening 174b corresponds to the second sub-pixels SP2 of FIG. 1 between the first sub-pixels SP1 of FIG. 1 and the third sub-pixels SP3 of FIG. 1. Here, the second opening 174b can be formed as one body all over the display device. Portions of the second bank 174 can have the same thickness from each other, or may have different thickness, such as whether the portion is part of the first, second and third openings 174a, 174b and 174c. As shown in FIGS. 1, 2A and 2B, the second bank 174 can be formed on the first bank 172, and can overlap the first bank 172 over some portions of the first bank 172. Where the second bank 174 forming the first opening overlaps the second pattern 1722 of the first bank 172 entirely, and such an overlap can be referred to as an intersection that is non-perpendicular. Also, the second bank 174 forming the first opening overlaps the first pattern 1721 of the first bank 172 by a small amount, and such a small overlap can all be referred to as an intersection that is non-perpendicular.

As described above, in the first embodiment of the present disclosure, the four first sub-pixels SP1 of FIG. 1 are arranged adjacent to each other, the four third sub-pixels SP3 of FIG. 1 are arranged adjacent to each other, and the second sub-pixels SP2 of FIG. 1 are disposed between the first and third sub-pixels SP1 and SP3 of FIG. 1 by the first bank 172 and the second bank 174. In embodiments of the present disclosure, the first bank 172 and the second bank 174 need not be straight or in a line form. For example, the first bank 172 and the second bank 174 can be curved, wavy, zigzag, have protrusions and/or indentations, and can have varying thicknesses. Also, first bank 172 and the second bank 174 may enclose different areas, so that the sub-pixels SP1, SP2 and SP3 may have different shapes, such as an oval shape, circular shape, star shape, or other geometric shapes. Also, the different areas of the subpixels SP1, SP2 and SP3 may have nested shapes, such that within a sub-pixel of one shape can be another enclosed area of the same or different shape.

A cross-sectional structure of the electroluminescent display device according to the first embodiment of the present disclosure will be described with reference to FIG. 3.

Figure 3:
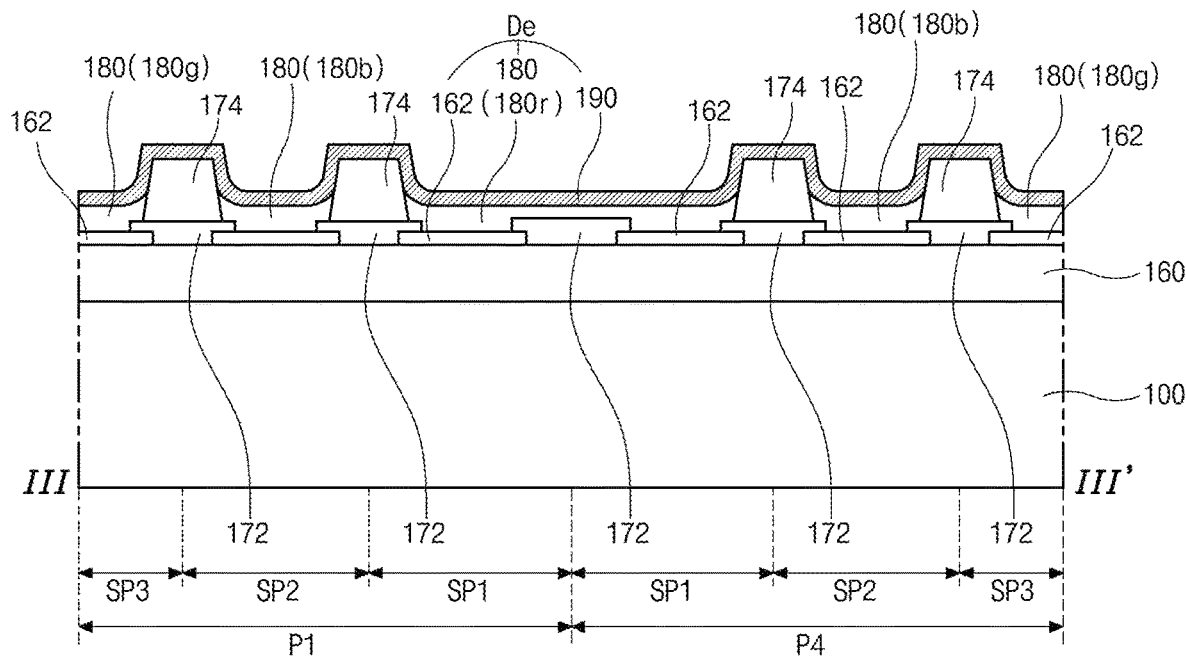
FIG. 3 is a schematic cross-sectional view of an electroluminescent display device according to the first embodiment of the present disclosure.

FIG. 3 is a schematic cross-sectional view of an electroluminescent display device according to the first embodiment of the present disclosure and shows a cross-section corresponding to the line III-III' of FIG. 1.

In FIG. 3, a plurality of pixels P1 and P4 each including first, second and third sub-pixels SP1, SP2 and SP3 are defined on a substrate 100, and an overcoat layer 160 is formed on the substrate 100. A first electrode 162 is formed at each of the sub-pixels SP1, SP2 and SP3 on the overcoat layer 160.

Figure 6:
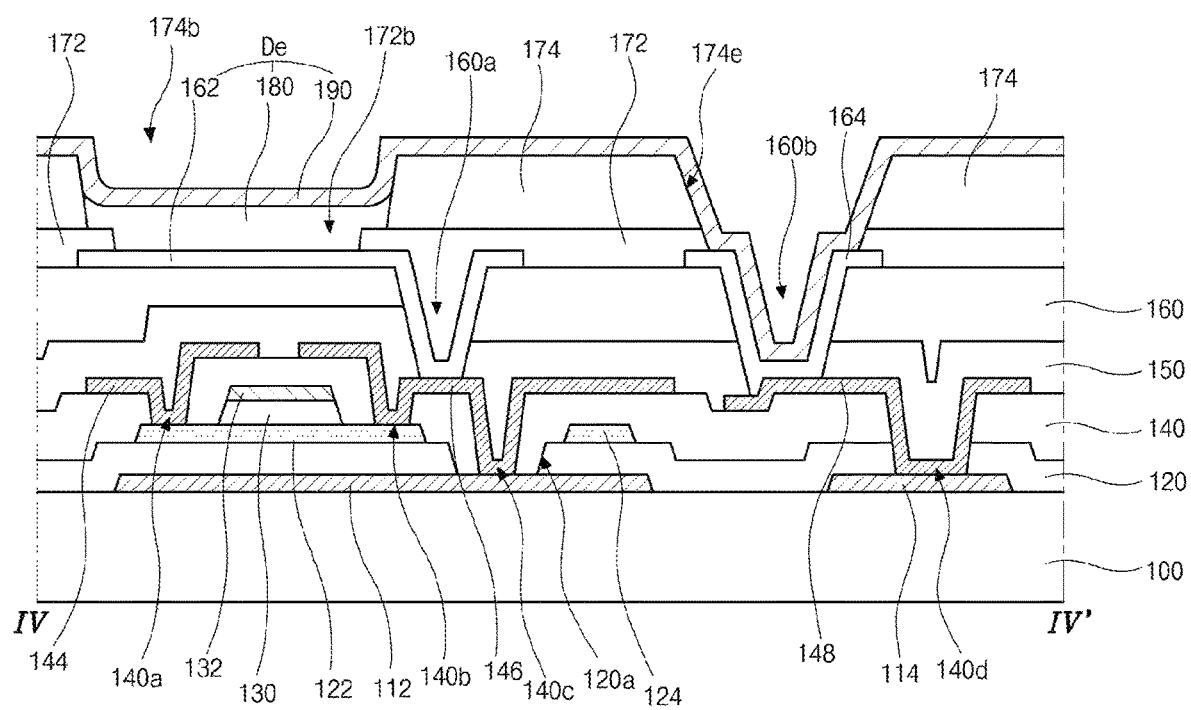
FIG. 6 is a schematic cross-sectional view of one sub-pixel of an electroluminescent display device according to the first embodiment of the present disclosure.

One or more thin film transistors, capacitors and insulating layers can be further formed between the substrate 100 and the overcoat layer 160, as shown in FIG. 6.

A first bank 172 is formed on the first electrode 162. The first bank 172 covers edges of the first electrode 162 and exposes a central portion of the first electrode 162. The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

The first bank 172 is formed in a region between adjacent pixels P1 and P4, that is, between adjacent same color sub-pixels SP1 and also formed in a region between adjacent different color sub-pixels SP1, SP2 and SP3.

Meanwhile, the second bank 174 is formed on the first bank 172 and overlaps the first bank 172. The second bank 174 can be formed of an organic insulating material having a hydrophobic property. Alternatively, the second bank 174 can be formed of an organic insulating material having a hydrophilic property and can be subjected to a hydrophobic treatment. The light emitting layer 180 is formed uniformly in light emitting areas of the same color sub-pixels SP1, SP2 and SP3. The light emitting layer 180 has a curved shape at edges that contact the second bank 174. However, the light emitting layers 180 is spread evenly and uniformly in the same color sub-pixels by the hydrophilic property of the first bank 172. As shown in FIG. 3, a height or a thickness of a portion of the light emitting layer 180 over only the first electrode 162 is different from a height or a thickness of the edge portion of the light emitting layer 180 adjacent the second bank 174, such as where edges of the first electrode 162, the first bank 172 and the second bank 174 are gathered. In FIG. 3, the edge portion of the light emitting layer 180 is also adjacent the first bank 172 because the first bank 172 and the second bank 174 overlap near the edge portion of the light emitting layer 180. Although the first bank 172 is shown as being thicker than the first electrode 162, the first electrode 162 can be thicker or the same in other embodiments.

Here, the second bank 174 is formed only in a region between adjacent different color sub-pixels SP1, SP2 and SP3, thereby exposing the first bank 172 between adjacent pixels P1 and P4, that is, between adjacent same color sub-pixels SP1. Namely, the second bank 174 exposes the first pattern 1721 of FIG. 2B of the first bank 172. A width of the second bank 174 is smaller than a width of the first bank 172, and a thickness of the second bank 174 is thicker than a thickness of the first bank 172.

A light-emitting layer 180 is formed on the first electrode 162 exposed at each sub-pixel SP1, SP2 and SP3. Here, a red light-emitting layer 180r is formed at the first sub-pixel SP1, a blue light-emitting layer 180b is formed at the second sub-pixel SP2, and a green light-emitting layer 180g is formed at the third sub-pixel SP3.

In addition, as shown in the figure, a red light-emitting layer 180r is further formed between the adjacent pixels P1 and P4, that is, on the first bank 172 exposed between the adjacent same color sub-pixels SP1. At this time, the red light-emitting layer 180r on the first bank 172 is connected to the red light-emitting layers 180r formed at the first sub-pixels SP1 of the adjacent pixels P1 and P4 to thereby form one body. The first bank 172 can have a first height, and the second bank 174 can have a second height. Also, the first height can be smaller than the second height. Additionally, the first bank 172 can define same color sub-pixels of different pixels, and the second bank 174 can define different color sub-pixels of the same pixel. The first bank 172 and the second bank 174 can have various cross sectional shapes other than a rectangular shape. For example, the first bank 172 and the second bank 174 can have cross sectional shapes such as a semicircular shape, triangular shape, a rhombus shape, an undercut shape, a t-shaped cross section, and others. Although the sub-pixels SP1, SP2 and SP3 are associated with red, blue and green colors, respectively in FIG. 1, such is not required, and sub-pixels SP1, SP2 and SP3 may have various colors.

Next, a second electrode 190 is formed on the light-emitting layer 180 and the second bank 174.

Here, the first electrode 162, the light-emitting layer 180 and the second electrode 190 constitute a light-emitting diode De. The first electrode 162 functions as an anode of the light-emitting diode De, and the second electrode 190 serves as a cathode of the light-emitting diode De.

As described above, in the electroluminescent display device according to the first embodiment of the present disclosure, the same color sub-pixels SP1 are arranged adjacent to each other, and the light-emitting layers 180r are formed by dropping a solution together in the adjacent sub-pixels SP1. Accordingly, the light-emitting layer 180r is formed on the first bank 172 between the adjacent same color sub-pixels SP1 as well as on the first electrode 162 of each sub-pixel SP1, and the light-emitting layers 180r on the first electrodes 162 in the adjacent same color sub-pixels SP1 are connected to the light-emitting layer 180r on the first bank 172.

A circuit configuration of an electroluminescent display device according to the first embodiment of the present disclosure will be described in more detail with reference to FIG. 4.

Figure 4:
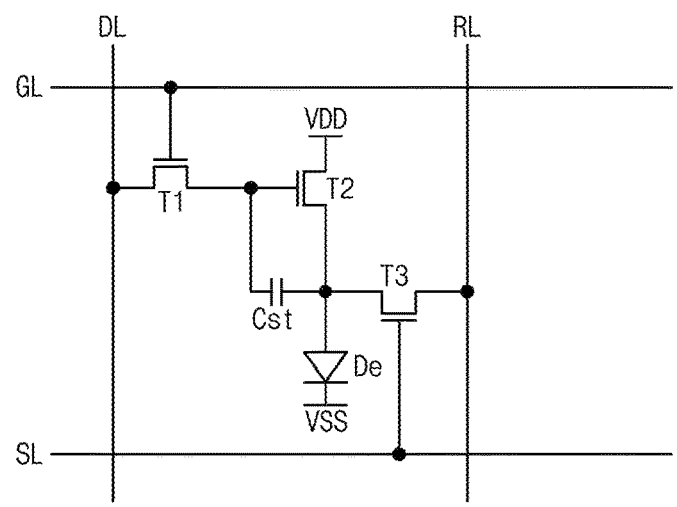
FIG. 4 is an equivalent circuit diagram of one sub-pixel of an electroluminescent display device according to the first embodiment of the present disclosure.

FIG. 4 is an equivalent circuit diagram of one sub-pixel of an electroluminescent display device according to the first embodiment of the present disclosure.

In FIG. 4, one sub-pixel of the electroluminescent display device according to the first embodiment of the present disclosure includes a switching thin film transistor T1, a driving thin film transistor T2, a storage capacitor Cst, a light-emitting diode De, and a sensing thin film transistor T3.

Specifically, a gate line GL and a data line DL cross each other, and the switching thin film transistor T1 is located at the crossing portion of the gate line GL and the data line DL. A gate of the switching thin film transistor T1 is connected to the gate line GL and a source of the switching thin film transistor T1 is connected to the data line DL.

In addition, a gate of the driving thin film transistor T2 is connected to a drain of the switching thin film transistor T1 and a first capacitor electrode of the storage capacitor Cst. A source of the driving thin film transistor T2 is connected to a high voltage supply VDD. A drain of the driving thin film transistor T2 is connected to an anode of the light-emitting diode De, a second capacitor electrode of the storage capacitor Cst, and a drain of the sensing thin film transistor T3.

A gate of the sensing thin film transistor T3 is connected to a sensing line SL, and a source of the sensing thin film transistor T3 is connected to a reference line RL.

Positions of the sources and drains of the thin film transistors T1, T2 and T3 are not limited thereto, and the positions can be changed with each other.

Meanwhile, a cathode of the light-emitting diode De is connected to a low voltage supply VSS. Alternatively, the cathode of the light-emitting diode De can be connected to a ground voltage.

During an emission period of one frame, the switching thin film transistor T1 is switched according to a gate signal transmitted through the gate line GL to supply a data signal transferred through the data line DL to the driving thin film transistor T2. The driving thin film transistor T2 is switched according to the data signal to control a current of the light-emitting diode De. At this time, the storage capacitor Cst maintains charges corresponding to the data signal for one frame to allow the amount of the current flowing through the light-emitting diode De to be constant and the gray level shown by the light-emitting diode D to be maintained until a next frame even if the switching thin film transistor T1 is turned off.

In addition, one frame further includes a sensing period. During the sensing period, the sensing thin film transistor T3 is switched according to a sensing signal transmitted through the sensing line SL to supply a reference voltage to the source of the driving thin film transistor T2, a voltage change of the source is detected through the reference line RL, and a threshold voltage Vth of the driving thin film transistor T2 is calculated by comparing the amount of the voltage change with the judgment range. Accordingly, the threshold voltage Vth is calculated in real time to compensate the image data. Thus, the characteristic change of the driving thin film transistor T2 is compensated, thereby preventing image quality degradation.

A planar structure of the electroluminescent display device according to the first embodiment of the present disclosure will be described in more detail with reference to FIG. 5.

Figure 5:
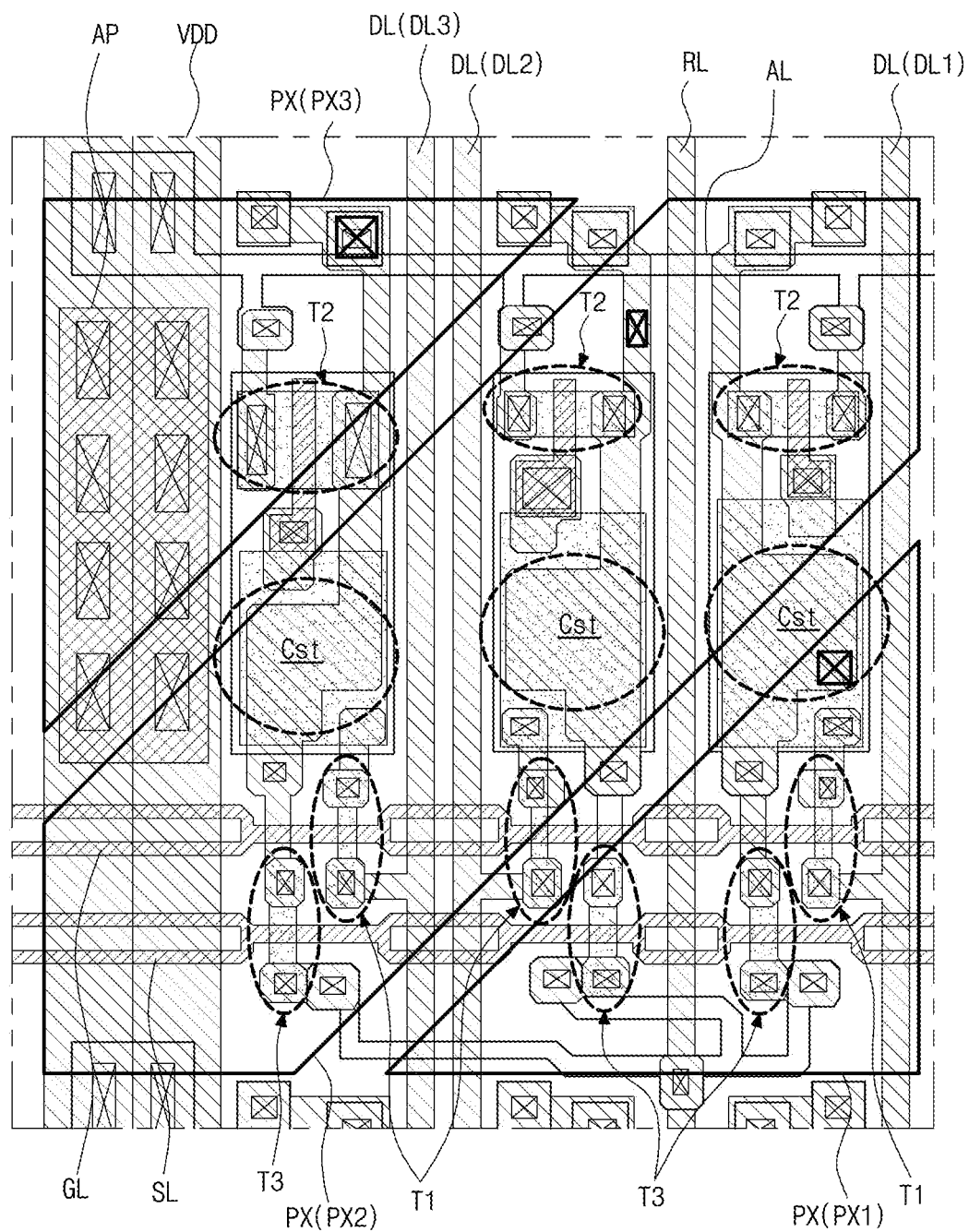
FIG. 5 is a schematic plan view of one pixel of an electroluminescent display device according to the first embodiment of the present disclosure.

FIG. 5 is a schematic plan view of one pixel of an electroluminescent display device according to the first embodiment of the present disclosure, which corresponds to the first pixel P1 of FIG. 1.

In FIG. 5, a gate line GL extends along a first direction. The gate line GL can be referred to as a scan line.

Further, a sensing line SL is spaced apart from the gate line GL and extends along the first direction. The sensing line SL can be formed of the same material on the same layer as the gate line GL.

On the other hand, an auxiliary line AL can be further formed along the first direction. The auxiliary line AL can be formed on a different layer from the gate line GL and the sensing line SL, but is not limited thereto.

Next, a data line DL, a high voltage supply line VDD and a reference line RL extend along a second direction. The data line DL, the high voltage supply line VDD and the reference line RL are formed on a different layer from the gate line GL, the sensing line SL and the auxiliary line AL and cross the gate line GL, the sensing line SL and the auxiliary line AL. At this time, portions of the gate line GL and the sensing line SL crossing and overlapping the data line DL, the high voltage supply line VDD and the reference line RL can have a wider width than the other portions, and can have openings therein to reduce parasitic capacitance.

Further, an auxiliary pattern AP overlapping the high voltage supply line VDD is formed. The auxiliary pattern AP serves to reduce the resistance of the high potential line VDD by contacting the high voltage supply line VDD. The auxiliary pattern AP can be formed of the same material on the same layer as the gate line GL. However, the present disclosure is not limited to this, and the high voltage supply line VDD can be formed on a different layer from the gate line GL and the high voltage supply line VDD.

The data line DL includes first, second and third data lines DL1, DL2 and DL3. The high voltage supply line VDD can have a wider width than each of the first, second and third data lines DL1, DL2 and DL3 and the reference line RL.

Here, the first data line DL1, the reference line RL, the second data line DL2, the third data line DL3, and the high voltage supply line VDD are sequentially located from the right side of FIG. 5.

Thin film transistors T1, T2, and T3 of a first sub-pixel SP1 of FIG. 1 and a storage capacitor Cst are disposed between the first data line DL1 and the reference line RL. Thin film transistors T1, T2, and T3 of a second sub-pixel SP2 of FIG. 1 and a storage capacitor Cst are disposed between the second data line DL2 and the third data line DL3. Thin film transistors T1, T2, and T3 and a storage capacitor Cst of a third sub-pixel SP3 of FIG. 1 are disposed between the third data line DL3 and the high voltage supply line VDD. In addition, the second and third data lines DL2 and DL3 are positioned adjacent to each other. However, the arrangement of the first, second, and third data lines DL1, DL2, and DL3, the reference line RL, and the high voltage supply line VDD is not limited thereto.

A switching thin film transistor T1 is positioned at the crossing portion of the gate line GL and each data line DL1, DL2 and DL3 and connected to the gate line GL and the data line DL1, DL2 and DL3. A driving thin film transistor T2 and a storage capacitor Cst are located between the gate line GL and the auxiliary line AL. The switching thin film transistor T1 is connected to the driving thin film transistor T2 and the storage capacitor Cst.

The driving thin film transistor T2 is connected to the high voltage supply line VDD through the auxiliary line AL and also connected to a pixel electrode PX, which is an anode of the light-emitting diode De of FIG. 4. In addition, the driving thin film transistor T2 is connected to the storage capacitor Cst.

Meanwhile, the gate line GL is located between the sensing line SL and the auxiliary line AL, more specifically between the storage capacitor Cst and the sensing line SL, and a sensing thin film transistor T3 is connected to the sensing line SL. The sensing thin film transistor T3 is also connected to the storage capacitor Cst and the reference line RL.

The pixel electrode PX, which is the anode of the light-emitting diode De of FIG. 4, includes first, second and third pixel electrodes PX1, PX2 and PX3 corresponding to the first, second and third sub-pixels SP1, SP2 and SP3 of FIG. 1, respectively. The first, second and third pixel electrodes PX1, PX2 and PX3 are sequentially arranged along a third direction crossing the first and second directions. That is, the first, second and third pixel electrodes PX1, PX2 and PX3 are sequentially arranged from the lower right to the upper left of the drawing. The first and third pixel electrodes PX1 and PX3 have a triangular shape and the second pixel electrode PX2 has a hexagonal shape. The first, second and third pixel electrodes PX1, PX2 and PX3 can be symmetrical with respect to a line passing through the center of the second pixel electrode PX2 along a fourth direction crossing the third direction.

First and second banks that cover the edges of the first, second and third pixel electrodes PX1, PX2 and PX3 are formed, and light-emitting layers are formed on the first, second and third pixel electrodes PX1, PX2 and PX3 exposed by the first and second banks. A common electrode which is a cathode of the light-emitting diode De of FIG. 4 is formed on the light-emitting layers all over the first, second and third sub-pixels SP1, SP2 and SP3.

FIG. 6 is a schematic cross-sectional view of one sub-pixel of an electroluminescent display device according to the first embodiment of the present disclosure, which corresponds to a second sub-pixel, for example, and shows a cross-section corresponding to the line IV-IV' of FIG. 1.

In FIG. 6, a light-shielding pattern 112 and a first auxiliary electrode 114 are formed of a first conductive material such as metal on a substrate 100. The substrate 100 can be a glass substrate or a plastic substrate. For example, polyimide can be used as the plastic substrate, but is not limited thereto.

For example, the light-shielding pattern 112 and the first auxiliary electrode 114 can be formed of at least one of aluminum (Al), copper (Cu), molybdenum (Mo), titanium (T1), chromium (Cr), nickel (Ni), tungsten (W) or an alloy thereof and can be a single layer or a multilayer structure.

In addition, an auxiliary line AL of FIG. 5 can be further formed of the first conductive material on the substrate 100.

A buffer layer 120 is formed on the light-shielding pattern 112 and the first auxiliary electrode 114 substantially all over the substrate 100. The buffer layer 120 can be formed of an inorganic material such as silicon oxide ($SiO_2$) or silicon nitride (SiNx) and can be a single layer or a multilayer.

Here, the buffer layer 120 has a buffer hole 120a on the light-shielding pattern 112, and the light-shielding pattern 112 is exposed through the buffer hole 120a.

A semiconductor layer 122 and a capacitor electrode 124 are patterned and formed on the buffer layer 120. The semiconductor layer 122 and the capacitor electrode 124 are spaced apart from each other over the light-shielding pattern 112. The semiconductor layer 122 and the capacitor electrode 124 can be formed of polycrystalline silicon, and impurities can be doped on both ends of the semiconductor layer 122 and the capacitor electrode 124. Alternatively, the semiconductor layer 122 and the capacitor electrode 124 can be formed of an oxide semiconductor material.

A gate insulating layer 130 of an insulating material and a gate electrode 132 of a second conductive material such as metal are sequentially formed on the semiconductor layer 122. The gate insulating layer 130 and the gate electrode 132 are positioned corresponding to the center of the semiconductor layer 122.

The gate insulating layer 130 can be formed of an inorganic insulating material such as silicon oxide ($SiO_2$) or silicon nitride (SiNx). Meanwhile, when the semiconductor layer 122 is formed of an oxide semiconductor material, the gate insulating layer 130 can be formed of silicon oxide ($SiO_2$).

Further, the gate electrode 132 can be formed of at least one of aluminum (Al), copper (Cu), molybdenum (Mo), titanium (T1), chromium (Cr), nickel (Ni), tungsten (W) or an alloy thereof and can be a single layer or a multilayer structure.

Here, the gate insulating layer 130 is shown to be patterned in the same shape as the gate electrode 132, but the gate insulating layer 130 can be formed substantially on the entire surface of the substrate 100.

In the meantime, a gate line GL of FIG. 5 and a sensing line SL of FIG. 5 can be further formed of the same material on the same layer as the gate electrode 132.

In addition, an auxiliary pattern AP of FIG. 5 can be further formed of the same material on the same layer as the gate electrode 132.

An interlayer insulating layer 140 of an insulating material is formed on the gate electrode 132 substantially all over the substrate 100. The interlayer insulating film 140 can be formed of an inorganic insulating material such as silicon oxide ($SiO_2$) or silicon nitride (SiNx). Alternatively, the interlayer insulating layer 140 can be formed of an organic insulating material such as photo acryl or benzocyclobutene.

The interlayer insulating film 140 has first, second, third and fourth contact holes 140a, 140b, 140c and 140d. The first and second contact holes 140a and 140b expose both ends of the semiconductor layer 122, respectively. The third contact hole 140c exposes the light-shielding pattern 112 and is located in the buffer hole 120a. Alternatively, the buffer hole 120a can be omitted, and the third contact hole 140c can also be formed in the buffer layer 120 to expose the light-shielding pattern 112. The fourth contact hole 140d is also formed in the buffer layer 120 to expose the first auxiliary electrode 114.

Source and drain electrodes 144 and 146 and a second auxiliary electrode 148 are formed of a third conductive material such as metal and on the interlayer insulating layer 140. The source and drain electrodes 144 and 146 and the second auxiliary electrode 148 can be formed of at least one of aluminum (Al), copper (Cu), molybdenum (Mo), titanium (T1), chromium (Cr), nickel (Ni), tungsten (W) or an alloy thereof and can be a single layer or a multilayer structure.

The source and drain electrodes 144 and 146 are in contact with both ends of the semiconductor layer 122 through the first and second contact holes 140a and 140b, respectively. Further, the drain electrode 146 contacts the light-shielding pattern 112 through the third contact hole 140c and overlaps the capacitor electrode 124. The capacitor electrode 124 overlaps the light-shielding pattern 112 and the drain electrode 146 to form a storage capacitor Cst of FIG. 5.

Meanwhile, the second auxiliary electrode 148 contacts the first auxiliary electrode 114 through the fourth contact hole 140d.

In addition, a data line DL of FIG. 5, a high voltage supply line VDD of FIG. 5, and a reference line RL of FIG. 5 can be further formed of the third conductive material on the interlayer insulating layer 140.

The semiconductor layer 122, the gate electrode 132, and the source and drain electrodes 144 and 146 form a thin film transistor. Here, the thin film transistor corresponds to the driving thin film transistor T2 of FIG. 5, and in the figure, a switching thin film transistor T1 of FIG. 5 and a sensing thin film transistor T3 of FIG. 5 having the same configuration as the thin film transistor can be further formed.

A passivation layer 150 of an insulating material is formed on the source and drain electrodes 144 and 146 and the second auxiliary electrode 148 substantially all over the substrate 100. The passivation layer 150 can be formed of an inorganic insulating material such as silicon oxide ($SiO_2$) or silicon nitride (SiNx).

Next, an overcoat layer 160 of an insulating material is formed on the passivation layer 150 substantially all over the substrate 100. The overcoat layer 160 can be formed of an organic insulating material such as photo acryl or benzocyclobutene.

One of the passivation layer 150 and the overcoat layer 160 can be omitted. For example, the passivation layer 150 can be omitted, but is not limited thereto.

The overcoat layer 160 has a drain contact hole 160a exposing the drain electrode 146 together with the passivation layer 150. In addition, the overcoat layer 160 has a fifth contact hole 160b exposing the second auxiliary electrode 148 together with the passivation layer 150.

A first electrode 162 is formed on the overcoat layer 160 and formed of a conductive material having a relatively high work function. The first electrode 162 is in contact with the drain electrode 146 through the drain contact hole 160a. For example, the first electrode 162 can be formed of a transparent conductive material such as indium tin oxide (ITO) or indium zinc oxide (IZO), but is not limited thereto.

Meanwhile, the electroluminescent display device according to the first embodiment of the present disclosure is a top emission type in which light of a light-emitting diode is output toward a direction opposite to the substrate 100. Accordingly, the first electrode 162 can further include a reflective electrode or a reflective layer formed of a metal material having a high reflectance below the transparent conductive material. For example, the reflective electrode or reflective layer can be formed of an aluminum-palladium-copper (APC) alloy or silver (Ag). At this time, the first electrode 162 can have a triple-layer structure of ITO/APC/ITO or ITO/Ag/ITO, but is not limited thereto.

Further, a third auxiliary electrode 164 is formed on the overcoat layer 160 and formed of the same material as the first electrode 162. The third auxiliary electrode 164 contacts the second auxiliary electrode 148 through the fifth contact hole 160b.

A first bank 172 and a second bank 174 of an insulating material are formed on the first electrode 162 to cover edges of the first electrode 162 and expose a central portion of the first electrode 162.

The first bank 172 corresponds to a region between adjacent sub-pixels SP1, SP2 and SP3 of FIG. 1 and has a hole 172b corresponding to each sub-pixel. The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

In addition, the second bank 174 corresponds to a region between adjacent different color sub-pixels SP1, SP2 and SP3 of FIG. 1 and has an opening 174b corresponding to each sub-pixel. The second bank 174 can be formed of an organic insulating material having a hydrophobic property.

Meanwhile, the second bank 174 has a sixth contact hole 174e exposing the third auxiliary electrode 164 together with the first bank 172. Alternatively, the first bank 172 can be omitted over the third auxiliary electrode 164.

A light-emitting layer 180 is formed on the exposed first electrode 162. The light-emitting layer 180 can include a first charge auxiliary layer, a light-emitting material layer, and a second charge auxiliary layer sequentially positioned over the first electrode 162. The light-emitting material layer can be formed of any one of red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto.

Here, the light-emitting layer 180 is formed through a solution process. Thus, the process can be simplified and a display device with a large size and high resolution can be provided. A spin coating method, an ink jet printing method, or a screen printing method can be used as the solution process, but the present disclosure is not limited thereto. At this time, since a drying speed of a solvent in a portion adjacent to the second bank 174 is different from that in other portions when a solution is dried, a thickness of the light-emitting layer 180 can be increased as it becomes close to the second bank 174 in a region adjacent to the second bank 174.

In the meantime, the electron auxiliary layer of the light emitting layer 180 can be formed through an evaporation process. At this time, the electron auxiliary layer can be formed substantially on the entire surface of the substrate 100.

In addition, in the first embodiment of the present disclosure, the light-emitting layer 180 is also formed on the first bank 172 between adjacent same color sub-pixels SP1, SP2 and SP3 of FIG. 1.

A second electrode 190 of a conductive material having a relatively low work function is formed on the light-emitting layer 180 and the second bank 174 substantially all over the substrate 100. Here, the second electrode 190 can be formed of aluminum (Al), magnesium (Mg), silver (Ag), or an alloy thereof. At this time, the second electrode 190 has a relatively thin thickness so that light from the light-emitting layer 180 can be transmitted. Alternatively, the second electrode 190 can be formed of a transparent conductive material such as indium-gallium-oxide (IGO), but is not limited thereto.

The second electrode 190 contacts the third auxiliary electrode 164 through the sixth contact hole 174e.

The first electrode 162, the light-emitting layer 180 and the second electrode 190 constitute a light-emitting diode De. Here, the first electrode 162 can serve as an anode, and the second electrode 190 can serve as a cathode, but the present disclosure is not limited thereto.

As described above, the electroluminescent display device according to the first embodiment of the present disclosure can be a top emission type in which light from the light-emitting layer 180 of the light-emitting diode De is output toward a direction opposite to the substrate 100, that is, output to the outside through the second electrode 190.

The top emission type display device can have a wider emission area than a bottom emission type display device of the same size, so that the brightness can be improved and the power consumption can be reduced.

At this time, the light-emitting diode De of each sub-pixel can have an element thickness for a micro-cavity effect corresponding to a wavelength of the emitted light, thereby increasing the light efficiency. That is, the light-emitting diodes De of the red, green and blue sub-pixels can have different element thicknesses. Here, the element thickness can be defined as a distance between the first electrode 162 and the second electrode 190.

Meanwhile, a protective layer and/or an encapsulating layer can be formed on the second electrode 190 substantially all over the substrate 100 to block moisture or oxygen introduced from the outside, thereby protecting the light-emitting diode De.

Second Embodiment

Figure 7:
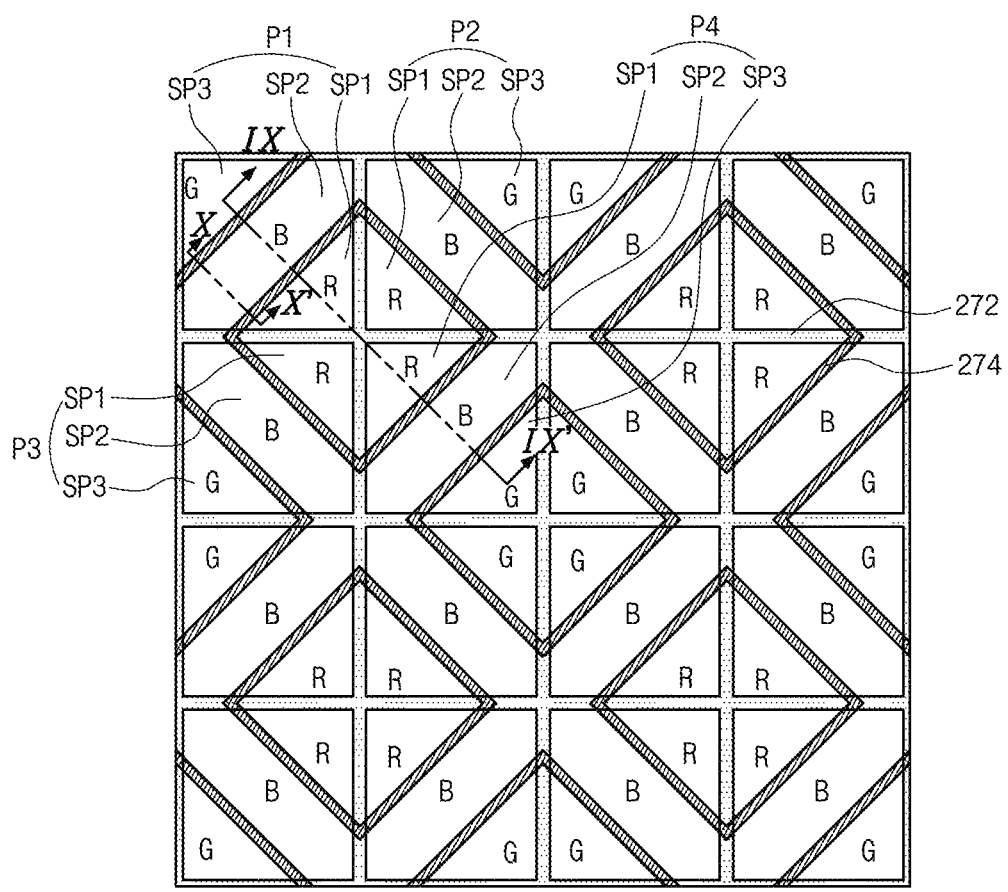
FIG. 7 is a schematic view of a pixel arrangement of an electroluminescent display device according to a second embodiment of the present disclosure.

FIG. 7 is a schematic view of a pixel arrangement of an electroluminescent display device according to a second embodiment of the present disclosure.

The electroluminescent display device according to the second embodiment of the present disclosure has the same pixel arrangement as the electroluminescent display device of the first embodiment except for a first bank. The similar or same parts will be designated by similar or same references, and descriptions of the similar or same parts will be omitted or shortened.

In FIG. 7, first, second, third and fourth pixels P1, P2, P3 and P4 are repeatedly arranged as one unit pixel group. At this time, the first, second, third and fourth pixels P1, P2, P3 and P4 are arranged in a matrix form and are adjacent to each other along first and second directions.

Each of the first, second, third and fourth pixels P1, P2, P3 and P4 includes first, second and third sub-pixels SP1, SP2 and SP3. The first, second and third sub-pixels SP1, SP2 and SP3 of each of the first, second, third and fourth pixels P1, P2, P3 and P4 are sequentially positioned along a direction crossing the first and second directions, that is, a diagonal direction. The second sub-pixel SP2 is disposed between the first and third sub-pixels SP1 and SP3. For example, the first, second and third sub-pixels SP1, SP2 and SP3 can be red, green and blue sub-pixels, respectively, but is not limited thereto.

The first sub-pixels SP1 of the first, second, third and fourth pixels P1, P2, P3 and P4 are arranged adjacent to each other, and the third sub-pixels SP3 of the first, second, third and fourth pixels P1, P2, P3 and P4 are arranged adjacent to the third sub-pixels of other unit pixel groups adjacent to the unit pixel group. The second sub-pixels SP2 of the first, second, third and fourth pixels P1, P2, P3 and P4 are disposed between the first and third sub-pixels SP1 and SP3 to surround the first sub-pixels SP1 adjacent to each other. In addition, the second sub-pixels SP2 of the first, second, third and fourth pixels P1, P2, P3 and P4 are arranged to surround the third sub-pixels SP3 adjacent thereto with the second sub-pixels of other unit pixel groups.

In the electroluminescent display device according to the second embodiment of the present disclosure, a light-emitting layer of each of the sub-pixels SP1, SP2 and SP3 is formed through a solution process. In this case, the light-emitting layers of the four first sub-pixels SP1 adjacent to each other are formed all at once, and the light-emitting layers of the four third sub-pixels SP3 adjacent to each other are formed all at once. That is, red light-emitting layers are formed by dropping a solution together in a region corresponding to the four first sub-pixels SP1 adjacent to each other and drying the solution, so that the red light-emitting layers of the four first sub-pixels SP1 adjacent to each other are connected to each other to form one body. In addition, green light-emitting layers are formed by dropping a solution together in a region corresponding to the four third sub-pixels SP3 adjacent to each other and drying the solution, so that the green light-emitting layers of the four third sub-pixels SP3 adjacent to each other are connected to each other to form one body.

Accordingly, even if the sizes of the first and third sub-pixels SP1 and SP3 decrease, the region for dropping the solution is larger than each of the first and third sub-pixels SP1 and SP3, and thus the light-emitting layers can be formed using the existing solution process apparatus. Therefore, the manufacturing costs can be reduced.

Meanwhile, blue light-emitting layers formed in the second sub-pixels SP2 of the respective pixels P1, P2, P3 and P4 are connected to each other to form one body. The blue light-emitting layers are also connected to the blue light-emitting layers of other unit pixel group adjacent to the unit pixel group to be all connected with respect to a substantially entire surface of the display device.

The pixel arrangement according to the second embodiment of the present disclosure can be implemented by a bank structure, that is, first and second banks 272 and 274. The bank structure according to the second embodiment of the present disclosure will be described with reference to FIGS. 8A and 8B.

Figure 8A:
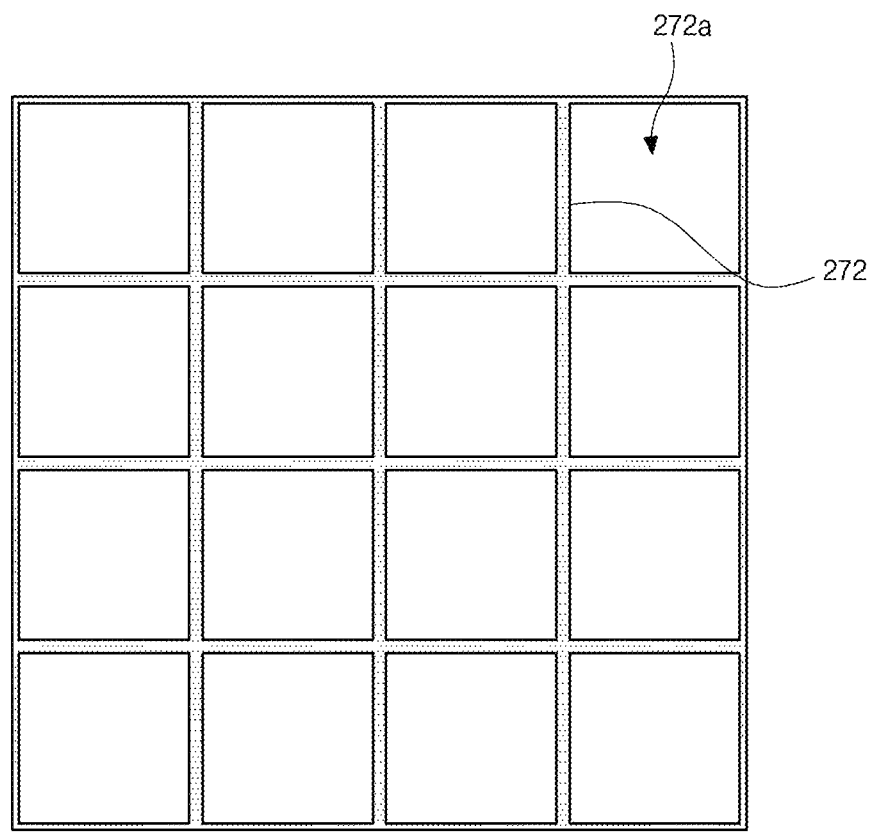
FIG. 8A is a view of schematically illustrating a first bank of the electroluminescent display device according to the second embodiment of the present disclosure.
Figure 8B:
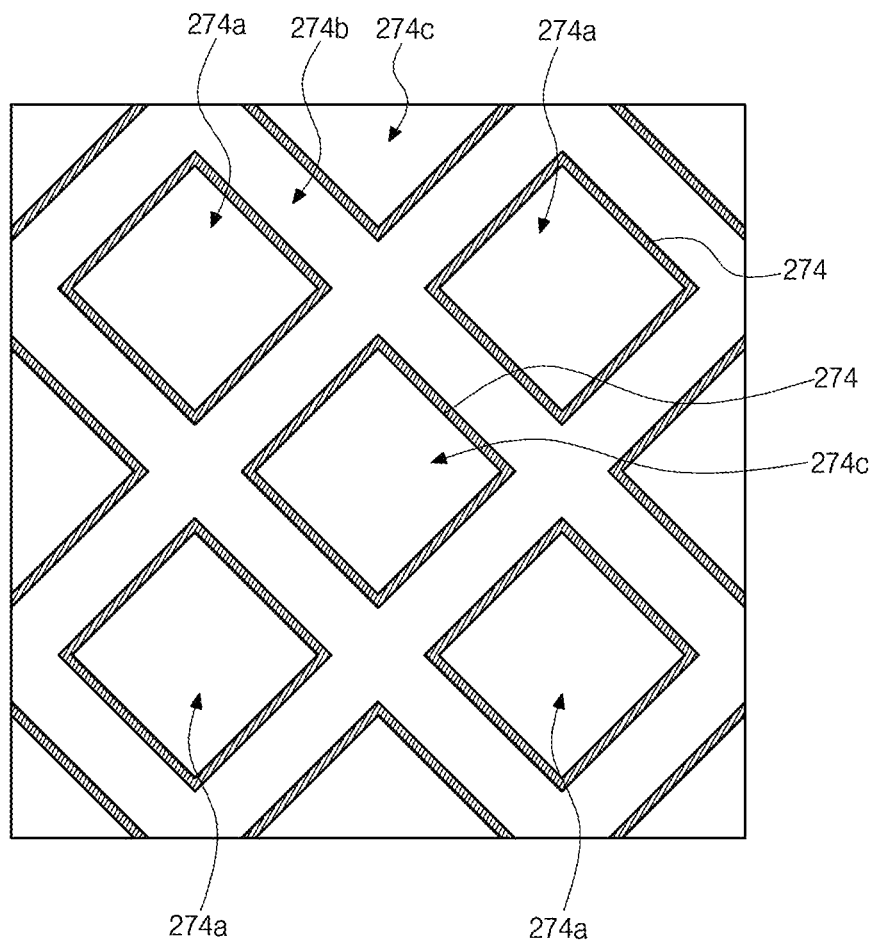
FIG. 8B is a view of schematically illustrating a second bank of the electroluminescent display device according to the second embodiment of the present disclosure.

FIG. 8A is a view of schematically illustrating a first bank of the electroluminescent display device according to the second embodiment of the present disclosure, and FIG. 8B is a view of schematically illustrating a second bank of the electroluminescent display device according to the second embodiment of the present disclosure.

In FIG. 8A, the first bank 272 according to the second embodiment of the present disclosure corresponds to a region between adjacent pixels P1, P2, P3 and P4 of FIG. 7, that is, between same color sub-pixels SP1, SP2 and SP3 of FIG. 7 and has a lattice shape along the first and second directions.

The first bank 272 has a hydrophilic property.

In addition, the first bank 272 has a hole 272a corresponding to each of the pixels P1, P2, P3 and P4 of FIG. 7.

Next, as shown in FIG. 8B, the second bank 274 according to the second embodiment of the present disclosure corresponds to a region between adjacent different color sub-pixels SP1, SP2 and SP3 of FIG. 7 and has a rectangular shape. For example, the second bank 274 can have a rhombic shape, but is not limited thereto.

The second bank 274 has a hydrophobic property.

Further, the second bank 274 has first, second and third openings 274a, 274b and 274c corresponding to the first, second and third sub-pixels SP1, SP2 and SP3 of FIG. 7, respectively. Namely, the first opening 274a corresponds to the four first sub-pixels SP1 of FIG. 7 adjacent to each other, the third opening 274c corresponds to the four third sub-pixels SP3 of FIG. 7 adjacent to each other, and the second opening 274b corresponds to the second sub-pixels SP2 of FIG. 7 between the first sub-pixels SP1 of FIG. 7 and the third sub-pixels SP3 of FIG. 7. Here, the second opening 274b can be formed as one body all over the display device.

As described above, in the second embodiment of the present disclosure, the four first sub-pixels SP1 of FIG. 7 are arranged adjacent to each other, the four third sub-pixels SP3 of FIG. 7 are arranged adjacent to each other, and the second sub-pixels SP2 of FIG. 7 are disposed between the first and third sub-pixels SP1 and SP3 of FIG. 7 by the first bank 272 and the second bank 274.

A cross-sectional structure of the electroluminescent display device according to the second embodiment of the present disclosure will be described with reference to FIG. 9.

Figure 9:
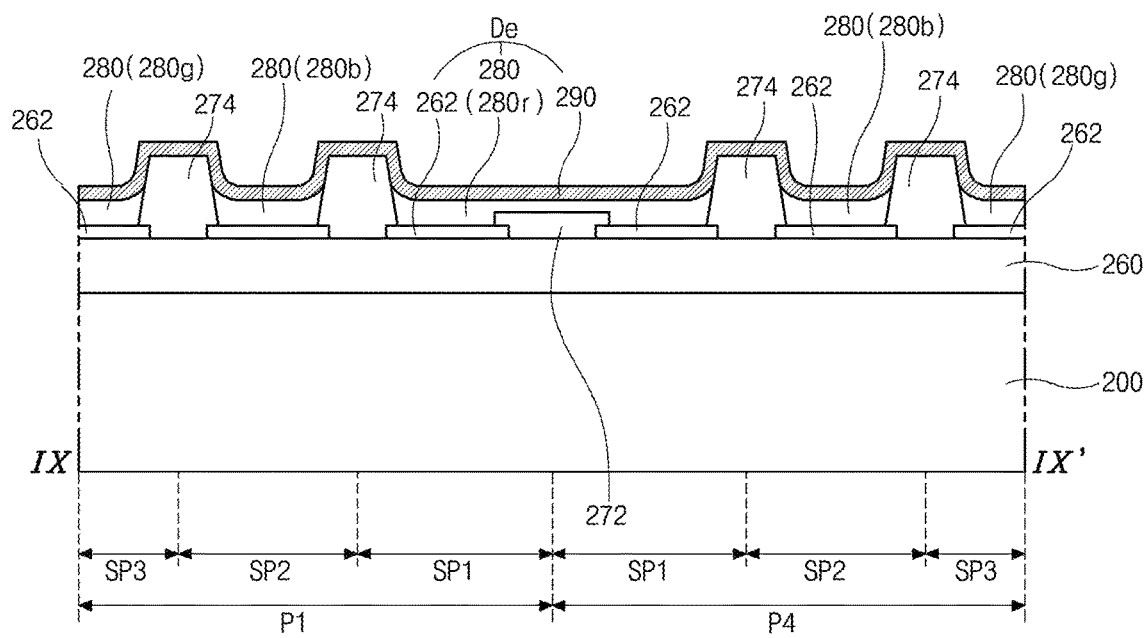
FIG. 9 is a schematic cross-sectional view of an electroluminescent display device according to the second embodiment of the present disclosure.

FIG. 9 is a schematic cross-sectional view of an electroluminescent display device according to the second embodiment of the present disclosure and shows a cross-section corresponding to the line IX-IX' of FIG. 7.

In FIG. 9, a plurality of pixels P1 and P4 each including first, second and third sub-pixels SP1, SP2 and SP3 are defined on a substrate 200, and an overcoat layer 260 is formed on the substrate 200. A first electrode 262 is formed at each of the sub-pixels SP1, SP2 and SP3 on the overcoat layer 260.

Figure 10:
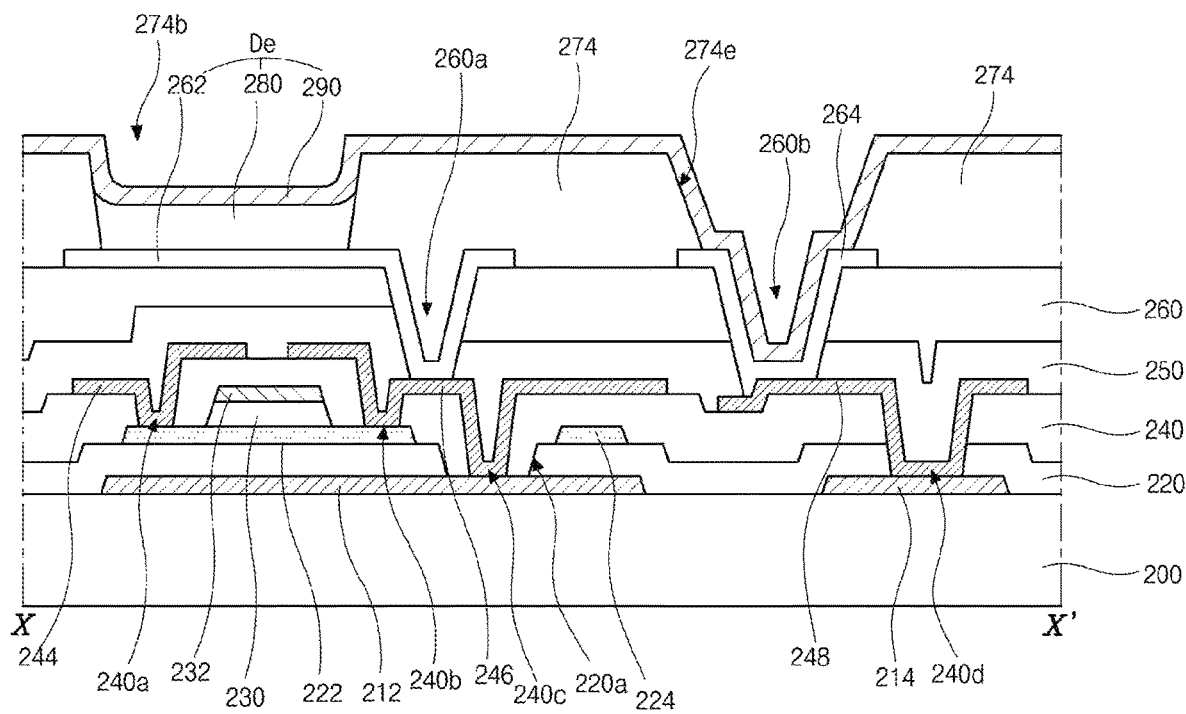
FIG. 10 is a schematic cross-sectional view of one sub-pixel of an electroluminescent display device according to the second embodiment of the present disclosure.

One or more thin film transistors, capacitors and insulating layers can be further formed between the substrate 200 and the overcoat layer 260, as shown in FIG. 10.

A first bank 272 and a second bank 274 are formed on the first electrode 262. The first bank 272 and the second bank 274 cover edges of the first electrode 262 and expose a central portion of the first electrode 262. The first bank 272 can be formed of a material having a hydrophilic property, for example, an inorganic insulating material such as silicon oxide ($SiO_2$) or silicon nitride (SiNx). Alternatively, the first bank 272 can be formed of polyimide.

The first bank 272 is formed in a region between adjacent pixels P1 and P4, that is, only between adjacent same color sub-pixels SP1.

Meanwhile, a second bank 274 is formed on the first bank 272, and in the figure, the second bank 274 has a portion crossing and overlapping the first bank 272. The second bank 274 can be formed of an organic insulating material having a hydrophobic property. Alternatively, the second bank 274 can be formed of an organic insulating material having a hydrophilic property and can be subjected to a hydrophobic treatment.

Here, the second bank 274 is formed only in a region between adjacent different color sub-pixels SP1, SP2 and SP3, thereby exposing the first bank 272 between adjacent pixels P1 and P4, that is, between adjacent same color sub-pixels SP1. A thickness of the second bank 274 is thicker than a thickness of the first bank 272.

A light-emitting layer 280 is formed on the first electrode 262 exposed at each sub-pixel SP1, SP2 and SP3. Here, a red light-emitting layer 280r is formed at the first sub-pixel SP1, a blue light-emitting layer 180b is formed at the second sub-pixel SP2, and a green light-emitting layer 280g is formed at the third sub-pixel SP3. The light-emitting layer 280 is formed uniformly in light emitting areas of the same color sub-pixels SP1, SP2 and SP3. The light emitting layer 280 has a curved shape at edges that contact the second bank 274. However, the light emitting layers 280 is spread evenly and uniformly in the same color sub-pixels by the hydrophilic property of the first bank 272. As shown in FIG. 9, a height or a thickness of a portion of the light emitting layer 280 over only the first electrode 262 is different from a height or a thickness of the edge portion of the light emitting layer 280 adjacent the second bank 274. such as where edges of the first electrode 262, the first bank 272 and the second bank 274 are gathered. Although the first bank 272 is shown as being thicker than the first electrode 262, the first electrode 162 can be thicker or the same in other embodiments.

In addition, as shown in the figure, a red light-emitting layer 280r is further formed between the adjacent pixels P1 and P4, that is, on the first bank 272 exposed between the adjacent same color sub-pixels SP1. At this time, the red light-emitting layer 280r on the first bank 272 is connected to the red light-emitting layers 280r formed at the first sub-pixels SP1 of the adjacent pixels P1 and P4 to thereby form one body.

Next, a second electrode 290 is formed on the light-emitting layer 280 and the second bank 274.

Here, the first electrode 262, the light-emitting layer 280 and the second electrode 290 constitute a light-emitting diode De. The first electrode 262 functions as an anode of the light-emitting diode De, and the second electrode 290 serves as a cathode of the light-emitting diode De.

As described above, in the electroluminescent display device according to the second embodiment of the present disclosure, the same color sub-pixels SP1 are arranged adjacent to each other, and the light-emitting layers 280r are formed by dropping a solution together in the adjacent sub-pixels SP1. Accordingly, the light-emitting layer 280r is formed on the first bank 272 between the adjacent same color sub-pixels SP1 as well as on the first electrode 262 of each sub-pixel SP1, and the light-emitting layers 280r on the first electrodes 262 in the adjacent same color sub-pixels SP1 are connected to the light-emitting layer 280r on the first bank 272.

Each of the pixels P1, P2, P3 and P4 of the electroluminescent display device according to the second embodiment of the present disclosure can have the same planar structure as that of FIG. 5, and each of the sub-pixels SP1, SP2 and SP3 can have the same circuit configuration as that of FIG. 4.

Meanwhile, each of the sub-pixels SP1, SP2 and SP3 of the electroluminescent display device according to the second embodiment of the present disclosure can have the same cross-sectional structure as the electroluminescent display device of the first embodiment except for the structure of the first bank 272, and this will be described in detail with reference to FIG. 10.

FIG. 10 is a schematic cross-sectional view of one sub-pixel of an electroluminescent display device according to the second embodiment of the present disclosure, which corresponds to a second sub-pixel, for example, and shows a cross-section corresponding to the line X-X' of FIG. 7.

In FIG. 10, a light-shielding pattern 212 and a first auxiliary electrode 214 are formed of a first conductive material such as metal on a substrate 200. The substrate 200 can be a glass substrate or a plastic substrate. For example, polyimide can be used as the plastic substrate, but is not limited thereto.

For example, the light-shielding pattern 212 and the first auxiliary electrode 214 can be formed of at least one of aluminum (Al), copper (Cu), molybdenum (Mo), titanium (T1), chromium (Cr), nickel (Ni), tungsten (W) or an alloy thereof and can be a single layer or a multilayer structure.

In addition, an auxiliary line AL of FIG. 5 can be further formed of the first conductive material on the substrate 200.

A buffer layer 220 is formed on the light-shielding pattern 212 and the first auxiliary electrode 214 substantially all over the substrate 200. The buffer layer 220 can be formed of an inorganic material such as silicon oxide ($SiO_2$) or silicon nitride (SiNx) and can be a single layer or a multilayer.

Here, the buffer layer 220 has a buffer hole 220a on the light-shielding pattern 212, and the light-shielding pattern 212 is exposed through the buffer hole 220a.

A semiconductor layer 222 and a capacitor electrode 224 are patterned and formed on the buffer layer 220. The semiconductor layer 222 and the capacitor electrode 224 are spaced apart from each other over the light-shielding pattern 212. The semiconductor layer 222 and the capacitor electrode 224 can be formed of polycrystalline silicon, and impurities can be doped on both ends of the semiconductor layer 222 and the capacitor electrode 224. Alternatively, the semiconductor layer 222 and the capacitor electrode 224 can be formed of an oxide semiconductor material.

A gate insulating layer 230 of an insulating material and a gate electrode 232 of a second conductive material such as metal are sequentially formed on the semiconductor layer 222. The gate insulating layer 230 and the gate electrode 232 are positioned corresponding to the center of the semiconductor layer 222.

The gate insulating layer 230 can be formed of an inorganic insulating material such as silicon oxide ($SiO_2$) or silicon nitride (SiNx). Meanwhile, when the semiconductor layer 222 is formed of an oxide semiconductor material, the gate insulating layer 230 can be formed of silicon oxide ($SiO_2$).

Further, the gate electrode 232 can be formed of at least one of aluminum (Al), copper (Cu), molybdenum (Mo), titanium (T1), chromium (Cr), nickel (Ni), tungsten (W) or an alloy thereof and can be a single layer or a multilayer structure.

Here, the gate insulating layer 230 is shown to be patterned in the same shape as the gate electrode 232, but the gate insulating layer 230 can be formed substantially on the entire surface of the substrate 200.

In the meantime, a gate line GL of FIG. 5 and a sensing line SL of FIG. 5 can be further formed of the same material on the same layer as the gate electrode 232.

In addition, an auxiliary pattern AP of FIG. 5 can be further formed of the same material on the same layer as the gate electrode 232.

An interlayer insulating layer 240 of an insulating material is formed on the gate electrode 232 substantially all over the substrate 200. The interlayer insulating film 240 can be formed of an inorganic insulating material such as silicon oxide ($SiO_2$) or silicon nitride (SiNx). Alternatively, the interlayer insulating layer 240 can be formed of an organic insulating material such as photo acryl or benzocyclobutene.

The interlayer insulating film 240 has first, second, third and fourth contact holes 240a, 240b, 240c and 240d. The first and second contact holes 240a and 240b expose both ends of the semiconductor layer 222, respectively. The third contact hole 240c exposes the light-shielding pattern 212 and is located in the buffer hole 220a. Alternatively, the buffer hole 220a can be omitted, and the third contact hole 240c can also be formed in the buffer layer 220 to expose the light-shielding pattern 212. The fourth contact hole 240d is also formed in the buffer layer 220 to expose the first auxiliary electrode 214.

Source and drain electrodes 244 and 246 and a second auxiliary electrode 248 are formed of a third conductive material such as metal and on the interlayer insulating layer 240. The source and drain electrodes 244 and 246 and the second auxiliary electrode 248 can be formed of at least one of aluminum (Al), copper (Cu), molybdenum (Mo), titanium (T1), chromium (Cr), nickel (Ni), tungsten (W) or an alloy thereof and can be a single layer or a multilayer structure.

The source and drain electrodes 244 and 246 are in contact with both ends of the semiconductor layer 222 through the first and second contact holes 240a and 240b, respectively. Further, the drain electrode 246 contacts the light-shielding pattern 212 through the third contact hole 240c and overlaps the capacitor electrode 224. The capacitor electrode 224 overlaps the light-shielding pattern 212 and the drain electrode 246 to form a storage capacitor Cst of FIG. 5.

Meanwhile, the second auxiliary electrode 248 contacts the first auxiliary electrode 214 through the fourth contact hole 240d.

In addition, a data line DL of FIG. 5, a high voltage supply line VDD of FIG. 5, and a reference line RL of FIG. 5 can be further formed of the third conductive material on the interlayer insulating layer 240.

The semiconductor layer 222, the gate electrode 232, and the source and drain electrodes 244 and 246 form a thin film transistor. Here, the thin film transistor corresponds to the driving thin film transistor T2 of FIG. 5, and in the figure, a switching thin film transistor T1 of FIG. 5 and a sensing thin film transistor T3 of FIG. 5 having the same configuration as the thin film transistor can be further formed.

A passivation layer 250 of an insulating material is formed on the source and drain electrodes 244 and 246 and the second auxiliary electrode 248 substantially all over the substrate 200. The passivation layer 250 can be formed of an inorganic insulating material such as silicon oxide ($SiO_2$) or silicon nitride (SiNx).

Next, an overcoat layer 260 of an insulating material is formed on the passivation layer 250 substantially all over the substrate 200. The overcoat layer 260 can be formed of an organic insulating material such as photo acryl or benzocyclobutene.

One of the passivation layer 250 and the overcoat layer 260 can be omitted. For example, the passivation layer 250 can be omitted, but is not limited thereto.

The overcoat layer 260 has a drain contact hole 260a exposing the drain electrode 246 together with the passivation layer 250. In addition, the overcoat layer 260 has a fifth contact hole 260b exposing the second auxiliary electrode 248 together with the passivation layer 250.

A first electrode 262 is formed on the overcoat layer 260 and formed of a conductive material having a relatively high work function. The first electrode 262 is in contact with the drain electrode 246 through the drain contact hole 260a. For example, the first electrode 262 can be formed of a transparent conductive material such as indium tin oxide (ITO) or indium zinc oxide (IZO), but is not limited thereto.

Meanwhile, the electroluminescent display device according to the second embodiment of the present disclosure is a top emission type in which light of a light-emitting diode is output toward a direction opposite to the substrate 200. Accordingly, the first electrode 262 can further include a reflective electrode or a reflective layer formed of a metal material having a high reflectance below the transparent conductive material. For example, the reflective electrode or reflective layer can be formed of an aluminum-palladium-copper (APC) alloy or silver (Ag). At this time, the first electrode 262 can have a triple-layer structure of ITO/APC/ITO or ITO/Ag/ITO, but is not limited thereto.

Further, a third auxiliary electrode 264 is formed on the overcoat layer 260 and formed of the same material as the first electrode 262. The third auxiliary electrode 264 contacts the second auxiliary electrode 248 through the fifth contact hole 260b.

A first bank 272 of FIG. 7 and a second bank 274 of an insulating material are formed on the first electrode 262 to cover edges of the first electrode 262 and expose a central portion of the first electrode 262.

The first bank 272 of FIG. 7 is formed to correspond to a region between adjacent pixels P1, P2, P3 and P4 of FIG. 7. At this time, the first bank 272 of FIG. 7 corresponds to a region between adjacent same color sub-pixels SP1, SP2 and SP3 of FIG. 7. The first bank 272 of FIG. 7 can be formed of a material having a hydrophilic property, for example, an inorganic insulating material such as silicon oxide ($SiO_2$) or silicon nitride (SiNx). Alternatively, the first bank 272 of FIG. 7 can be formed of polyimide.

In addition, the second bank 274 corresponds to a region between adjacent different color sub-pixels SP1, SP2 and SP3 of FIG. 7 and has an opening 274b corresponding to each sub-pixel. The second bank 274 can be formed of an organic insulating material having a hydrophobic property.

Meanwhile, the second bank 274 has a sixth contact hole 274e exposing the third auxiliary electrode 264.

A light-emitting layer 280 is formed on the exposed first electrode 262. The light-emitting layer 280 can include a first charge auxiliary layer, a light-emitting material layer, and a second charge auxiliary layer sequentially positioned over the first electrode 262. The light-emitting material layer can be formed of any one of red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto.

Here, the light-emitting layer 280 is formed through a solution process. Thus, the process can be simplified and a display device with a large size and high resolution can be provided. A spin coating method, an ink jet printing method, or a screen printing method can be used as the solution process, but the present disclosure is not limited thereto. At this time, since a drying speed of a solvent in a portion adjacent to the second bank 274 is different from that in other portions when a solution is dried, a thickness of the light-emitting layer 280 can be increased as it becomes close to the second bank 274 in a region adjacent to the second bank 274.

In the meantime, the electron auxiliary layer of the light emitting layer 280 can be formed through an evaporation process. At this time, the electron auxiliary layer can be formed substantially on the entire surface of the substrate 200.

In addition, in the second embodiment of the present disclosure, the light-emitting layer 280 is also formed on the first bank 272 of FIG. 7 between adjacent same color sub-pixels SP1, SP2 and SP3 of FIG. 7.

A second electrode 290 of a conductive material having a relatively low work function is formed on the light-emitting layer 280 and the second bank 274 substantially all over the substrate 200. Here, the second electrode 290 can be formed of aluminum (Al), magnesium (Mg), silver (Ag), or an alloy thereof. At this time, the second electrode 290 has a relatively thin thickness so that light from the light-emitting layer 280 can be transmitted. Alternatively, the second electrode 290 can be formed of a transparent conductive material such as indium-gallium-oxide (IGO), but is not limited thereto.

The second electrode 290 contacts the third auxiliary electrode 264 through the sixth contact hole 274e.

The first electrode 262, the light-emitting layer 280 and the second electrode 290 constitute a light-emitting diode De. Here, the first electrode 262 can serve as an anode, and the second electrode 290 can serve as a cathode, but the present disclosure is not limited thereto.

As described above, the electroluminescent display device according to the second embodiment of the present disclosure can be a top emission type in which light from the light-emitting layer 280 of the light-emitting diode De is output toward a direction opposite to the substrate 200, that is, output to the outside through the second electrode 290. The top emission type display device can have a wider emission area than a bottom emission type display device of the same size, so that the brightness can be improved and the power consumption can be reduced.

At this time, the light-emitting diode De of each sub-pixel can have an element thickness for a micro-cavity effect corresponding to a wavelength of the emitted light, thereby increasing the light efficiency. That is, the light-emitting diodes De of the red, green and blue sub-pixels can have different element thicknesses. Here, the element thickness can be defined as a distance between the first electrode 262 and the second electrode 290.

Meanwhile, a protective layer and/or an encapsulating layer can be formed on the second electrode 290 substantially all over the substrate 200 to block moisture or oxygen introduced from the outside, thereby protecting the light-emitting diode De.

Third Embodiment

Figure 11:
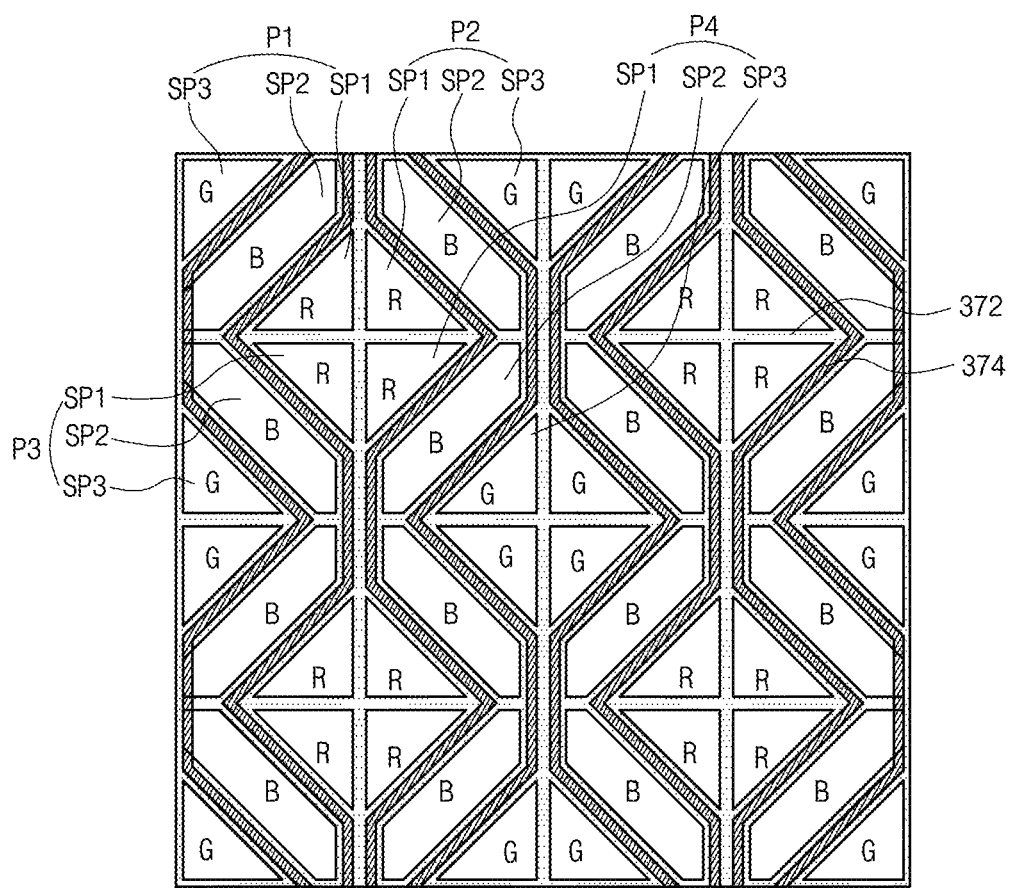
FIG. 11 is a schematic view of a pixel arrangement of an electroluminescent display device according to a third embodiment of the present disclosure.

FIG. 11 is a schematic view of a pixel arrangement of an electroluminescent display device according to a third embodiment of the present disclosure.

The electroluminescent display device according to the third embodiment of the present disclosure has the same pixel arrangement as the electroluminescent display device of the first embodiment except for a first bank and a second bank. The similar or same parts will be designated by similar or same references, and descriptions of the similar or same parts will be omitted or shortened.

In FIG. 11, first, second, third and fourth pixels P1, P2, P3 and P4 are repeatedly arranged as one unit pixel group. At this time, the first, second, third and fourth pixels P1, P2, P3 and P4 are arranged in a matrix form and are adjacent to each other along first and second directions.

Each of the first, second, third and fourth pixels P1, P2, P3 and P4 includes first, second and third sub-pixels SP1, SP2 and SP3. The first, second and third sub-pixels SP1, SP2 and SP3 of each of the first, second, third and fourth pixels P1, P2, P3 and P4 are sequentially positioned along a direction crossing the first and second directions, that is, a diagonal direction. The second sub-pixel SP2 is disposed between the first and third sub-pixels SP1 and SP3. For example, the first, second and third sub-pixels SP1, SP2 and SP3 can be red, green and blue sub-pixels, respectively, but is not limited thereto.

The first sub-pixels SP1 of the first, second, third and fourth pixels P1, P2, P3 and P4 are arranged adjacent to each other, and the third sub-pixels SP3 of the first, second, third and fourth pixels P1, P2, P3 and P4 are arranged adjacent to the third sub-pixels of other unit pixel groups adjacent to the unit pixel group. The second sub-pixels SP2 of the first, second, third and fourth pixels P1, P2, P3 and P4 are disposed between the first and third sub-pixels SP1 and SP3 to surround the first sub-pixels SP1 adjacent to each other. In addition, the second sub-pixels SP2 of the first, second, third and fourth pixels P1, P2, P3 and P4 are arranged to surround the third sub-pixels SP3 adjacent thereto with the second sub-pixels of other unit pixel groups.

Meanwhile, the first, second and third sub-pixels SP1, SP2 and SP3 are connected to the sub-pixels of the same color along the second direction. More specifically, the four first sub-pixels SP1 of the first, second, third and fourth pixels P1, P2, P3 and P4 adjacent to each other are connected to four first sub-pixels of another unit pixel group adjacent to the unit pixel group along the second direction, and the four third sub-pixels SP3 of the first, second, third and fourth pixels P1, P2, P3 and P4 adjacent to each other are connected to four third sub-pixels of another unit pixel group adjacent to the unit pixel group along the second direction. Further, the second sub-pixels SP2 of the first and third pixels P1 and P3 are connected to second sub-pixels of another unit pixel group adjacent to the unit pixel group along the second direction, and the second sub-pixels SP2 of the second and fourth pixels P2 and P4 are separated from the second sub-pixels SP2 of the first and third pixels P1 and P2 and connected to the second sub-pixels of second sub-pixels of another unit pixel group adjacent to the unit pixel group along the second direction.

In the electroluminescent display device according to the third embodiment of the present disclosure, a light-emitting layer of each of the sub-pixels SP1, SP2 and SP3 is formed through a solution process. In this case, the light-emitting layers of the four first sub-pixels SP1 adjacent to each other are formed all at once, and the light-emitting layers of the four third sub-pixels SP3 adjacent to each other are formed all at once. That is, red light-emitting layers are formed by dropping a solution together in a region corresponding to the four first sub-pixels SP1 adjacent to each other and drying the solution, so that the red light-emitting layers of the four first sub-pixels SP1 adjacent to each other are connected to each other to form one body. In addition, green light-emitting layers are formed by dropping a solution together in a region corresponding to the four third sub-pixels SP3 adjacent to each other and drying the solution, so that the green light-emitting layers of the four third sub-pixels SP3 adjacent to each other are connected to each other to form one body.

Accordingly, even if the sizes of the first and third sub-pixels SP1 and SP3 decrease, the region for dropping the solution is larger than each of the first and third sub-pixels SP1 and SP3, and thus the light-emitting layers can be formed using the existing solution process apparatus. Therefore, the manufacturing costs can be reduced.

In addition, the first, second and third sub-pixels SP1, SP2 and SP3 are connected to the sub-pixels SP1, SP2 and SP3 of the same color along the second direction, and the same color sub-pixels SP1, SP2 and SP3 connected to each other along the second direction include the light-emitting layers connected to each other to form one body. Accordingly, when the light-emitting layers are formed through the solution process, a deviation in the amount of dropping between nozzles is minimized, and thicknesses of the light-emitting layers can be uniform in the respective sub-pixels SP1, SP2 and SP3.

The pixel arrangement according to the third embodiment of the present disclosure can be implemented by a bank structure, that is, first and second banks 372 and 374. The bank structure according to the third embodiment of the present disclosure will be described with reference to FIGS. 12A and 12B.

Figure 12A:
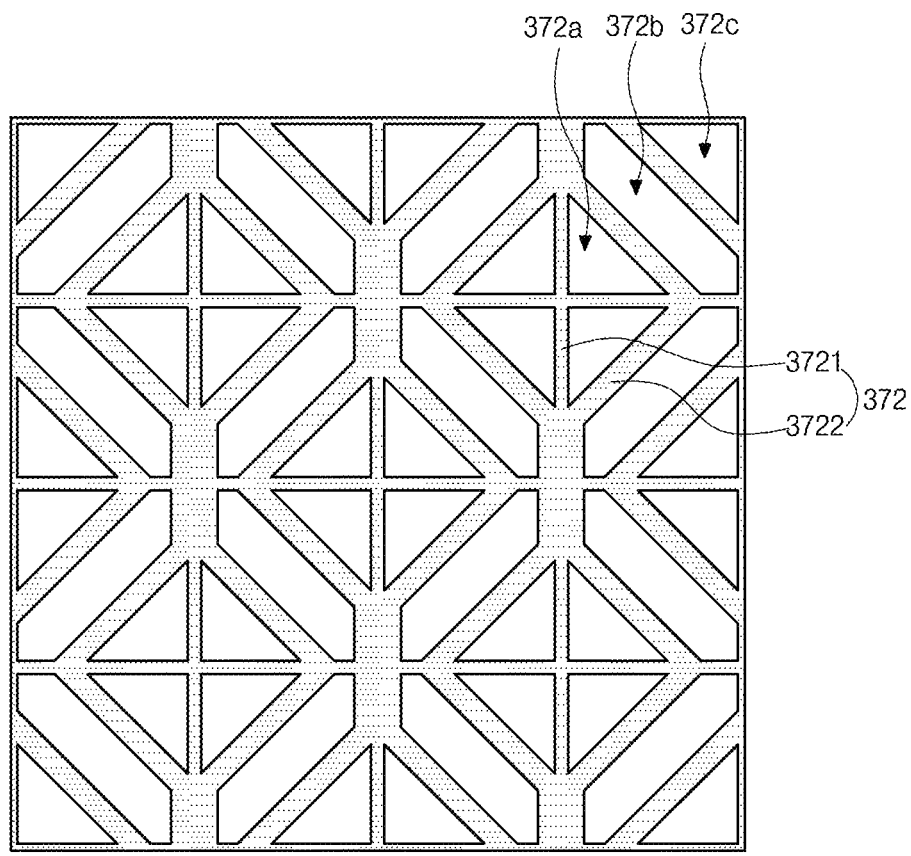
FIG. 12A is a view of schematically illustrating a first bank of the electroluminescent display device according to the third embodiment of the present disclosure.
Figure 12B:
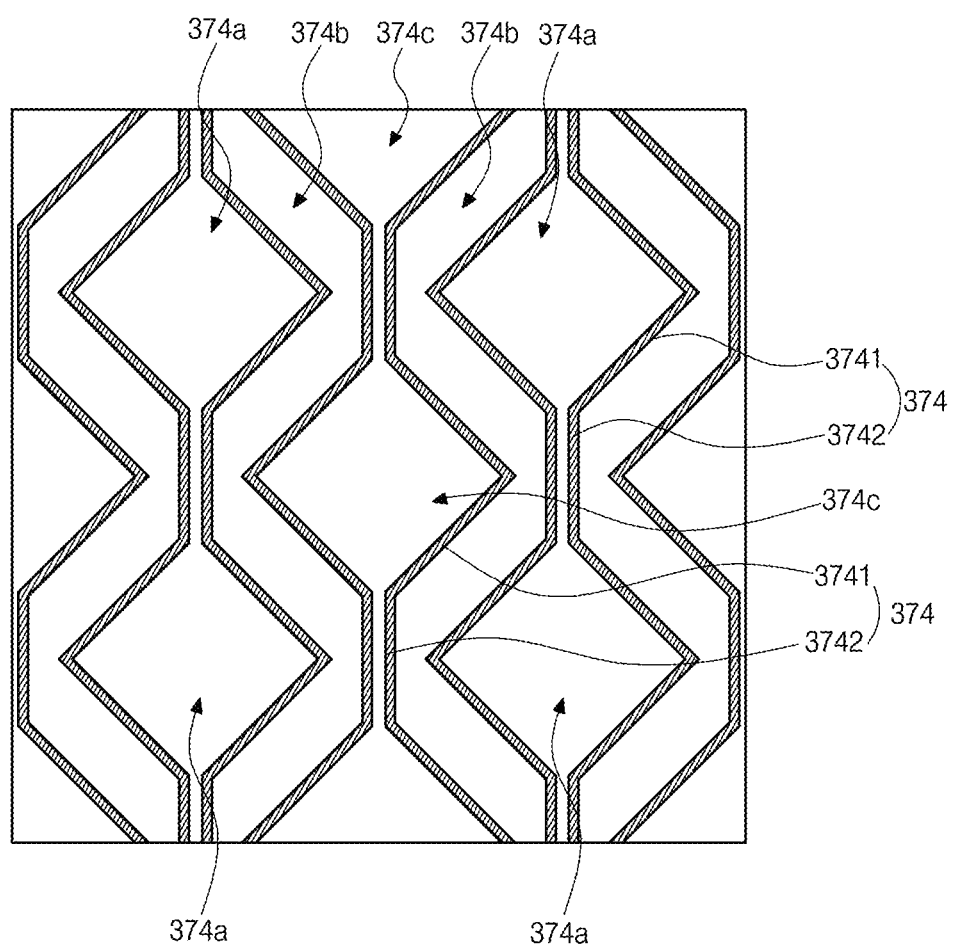
FIG. 12B is a view of schematically illustrating a second bank of the electroluminescent display device according to the third embodiment of the present disclosure.

FIG. 12A is a view of schematically illustrating a first bank of the electroluminescent display device according to the third embodiment of the present disclosure, and FIG. 12B is a view of schematically illustrating a second bank of the electroluminescent display device according to the third embodiment of the present disclosure.

In FIG. 12A, the first bank 372 according to the third embodiment of the present disclosure is formed between adjacent sub-pixels P1, P2, P3 and P4 of FIG. 11 and includes a first pattern 3721 and a second pattern 3722. The first bank 372 has a hydrophilic property.

The first pattern 3721 of the first bank 372 corresponds to a region between adjacent pixels P1, P2, P3 and P4 of FIG. 11, that is, between adjacent same color sub-pixels SP1, SP2 and SP3 of FIG. 11 and has a lattice shape along the first and second directions. In addition, the second pattern 3722 corresponds to a region between adjacent different color sub-pixels SP1, SP2 and SP3 of FIG. 11 and has a rectangular shape.

Here, the first pattern 3721 of the first pattern 372 can have different widths. Specifically, a width of the first pattern 3721 between parts of the second pattern 3722 can be larger than a width of the first pattern 3721 disposed in the second pattern 3722, that is, surrounded by the second pattern 3722, but is not limited thereto. Alternatively, the first pattern 3721 of the first bank 372 can have a uniform width.

In addition, a width of the second pattern 3722 of the first bank 372 is shown to be larger than the width of the first pattern 3721 surrounded by the second pattern 3722, but is not limited thereto. The first pattern 3721 and the second pattern 3722 of the first bank 372 can have the same width.

The first bank 372 has first, second and third holes 372a, 372b and 372c corresponding to the first, second and third sub-pixels SP1, SP2 and SP3 of FIG. 11, respectively.

Next, as shown in FIG. 12B, the second bank 374 according to the third embodiment of the present disclosure includes a first pattern 3741 and a second pattern 3742. The first pattern 3741 of the second bank 374 corresponds to a region between adjacent different color sub-pixels SP1, SP2 and SP3 of FIG. 11 and has a substantially rectangular shape. The second pattern 3742 of the second bank 374 corresponds to a region between the second sub-pixels SP2 of FIG. 11 adjacent to each other along the first direction and connects the first patterns 3741 of the second bank 374 adjacent to each other along the second direction.

The first pattern 3741 of the second bank 374 corresponds to and overlaps the second pattern 3722 of the first bank 372, and the second pattern 3742 of the second bank 374 partially overlaps the first pattern 3721 of the first bank 372. At this time, it is beneficial that a width of the second bank 374 is smaller than the width of the first bank 372 in the overlapping region.

The second bank 374 has a hydrophobic property.

In the meantime, the second bank 374 has first, second and third openings 374a, 374b and 374c corresponding to the first, second and third sub-pixels SP1, SP2 and SP3 of FIG. 11, respectively. Namely, the first opening 374a corresponds to the four first sub-pixels SP1 of FIG. 11 adjacent to each other, the third opening 374c corresponds to the four third sub-pixels SP3 of FIG. 11 adjacent to each other, and the second opening 374b corresponds to the second sub-pixels SP2 of FIG. 11 between the first sub-pixels SP1 of FIG. 11 and the third sub-pixels SP3 of FIG. 11. Here, each of the first, second and third openings 374a, 374b and 374c is connected to the corresponding opening along the second direction to form one body. That is, the first openings 374a adjacent to each other along the second direction are connected to each other, the second openings 374b adjacent to each other along the second direction are connected to each other, and the third openings 374c adjacent to each other along the second direction are connected to each other.

Accordingly, in the third embodiment of the present disclosure, the four first sub-pixels SP1 of FIG. 11 are arranged adjacent to each other, the four third sub-pixels SP3 of FIG. 11 are arranged adjacent to each other, and the second sub-pixels SP2 of FIG. 11 are disposed between the first and third sub-pixels SP1 and SP3 of FIG. 11 by the first bank 372 and the second bank 374.

In the electroluminescent display device according to the third embodiment of the present disclosure, each of the pixels P1, P2, P3 and P4 can have the same planar structure as that of FIG. 5, and each of the sub-pixels SP1, SP2 and SP3 can have the same circuit configuration as that of FIG. 4. Further, each of the sub-pixels SP1, SP2 and SP3 can have substantially the same cross-sectional structure as that of FIG. 6.

Fourth Embodiment

Figure 13:
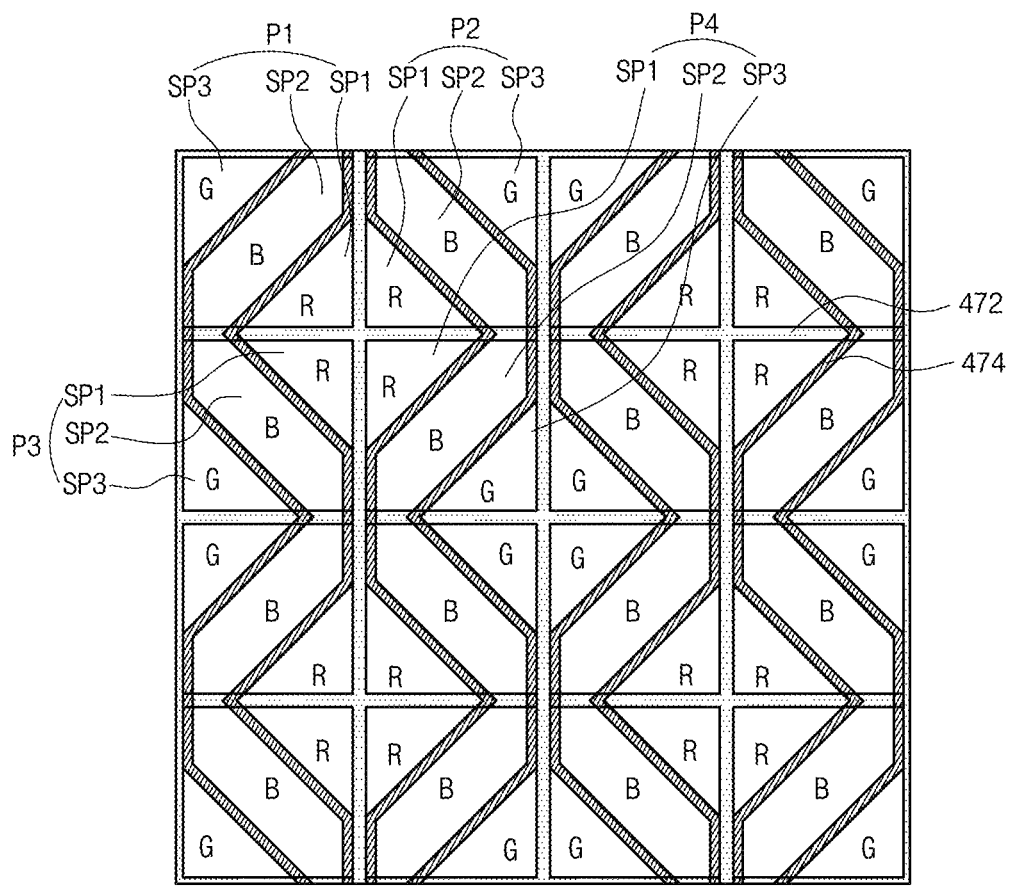
FIG. 13 is a schematic view of a pixel arrangement of an electroluminescent display device according to a fourth embodiment of the present disclosure.

FIG. 13 is a schematic view of a pixel arrangement of an electroluminescent display device according to a fourth embodiment of the present disclosure.

The electroluminescent display device according to the fourth embodiment of the present disclosure has the same pixel arrangement as the electroluminescent display device of the first embodiment except for a first bank and a second bank. The similar or same parts will be designated by similar or same references, and descriptions of the similar or same parts will be omitted or shortened.

In FIG. 13, first, second, third and fourth pixels P1, P2, P3 and P4 are repeatedly arranged as one unit pixel group. At this time, the first, second, third and fourth pixels P1, P2, P3 and P4 are arranged in a matrix form and are adjacent to each other along first and second directions.

Each of the first, second, third and fourth pixels P1, P2, P3 and P4 includes first, second and third sub-pixels SP1, SP2 and SP3. The first, second and third sub-pixels SP1, SP2 and SP3 of each of the first, second, third and fourth pixels P1, P2, P3 and P4 are sequentially positioned along a direction crossing the first and second directions, that is, a diagonal direction. The second sub-pixel SP2 is disposed between the first and third sub-pixels SP1 and SP3. For example, the first, second and third sub-pixels SP1, SP2 and SP3 can be red, green and blue sub-pixels, respectively, but is not limited thereto.

The first sub-pixels SP1 of the first, second, third and fourth pixels P1, P2, P3 and P4 are arranged adjacent to each other, and the third sub-pixels SP3 of the first, second, third and fourth pixels P1, P2, P3 and P4 are arranged adjacent to the third sub-pixels of other unit pixel groups adjacent to the unit pixel group. The second sub-pixels SP2 of the first, second, third and fourth pixels P1, P2, P3 and P4 are disposed between the first and third sub-pixels SP1 and SP3 to surround the first sub-pixels SP1 adjacent to each other. In addition, the second sub-pixels SP2 of the first, second, third and fourth pixels P1, P2, P3 and P4 are arranged to surround the third sub-pixels SP3 adjacent thereto with the second sub-pixels of other unit pixel groups.

Meanwhile, the first, second and third sub-pixels SP1, SP2 and SP3 are connected to the sub-pixels of the same color along the second direction. More specifically, the four first sub-pixels SP1 of the first, second, third and fourth pixels P1, P2, P3 and P4 adjacent to each other are connected to four first sub-pixels of another unit pixel group adjacent to the unit pixel group along the second direction, and the four third sub-pixels SP3 of the first, second, third and fourth pixels P1, P2, P3 and P4 adjacent to each other are connected to four third sub-pixels of another unit pixel group adjacent to the unit pixel group along the second direction. Further, the second sub-pixels SP2 of the first and third pixels P1 and P3 are connected to second sub-pixels of another unit pixel group adjacent to the unit pixel group along the second direction, and the second sub-pixels SP2 of the second and fourth pixels P2 and P4 are separated from the second sub-pixels SP2 of the first and third pixels P1 and P2 and connected to the second sub-pixels of second sub-pixels of another unit pixel group adjacent to the unit pixel group along the second direction.

In the electroluminescent display device according to the fourth embodiment of the present disclosure, a light-emitting layer of each of the sub-pixels SP1, SP2 and SP3 is formed through a solution process. In this case, the light-emitting layers of the four first sub-pixels SP1 adjacent to each other are formed all at once, and the light-emitting layers of the four third sub-pixels SP3 adjacent to each other are formed all at once. That is, red light-emitting layers are formed by dropping a solution together in a region corresponding to the four first sub-pixels SP1 adjacent to each other and drying the solution, so that the red light-emitting layers of the four first sub-pixels SP1 adjacent to each other are connected to each other to form one body. In addition, green light-emitting layers are formed by dropping a solution together in a region corresponding to the four third sub-pixels SP3 adjacent to each other and drying the solution, so that the green light-emitting layers of the four third sub-pixels SP3 adjacent to each other are connected to each other to form one body.

Accordingly, even if the sizes of the first and third sub-pixels SP1 and SP3 decrease, the region for dropping the solution is larger than each of the first and third sub-pixels SP1 and SP3, and thus the light-emitting layers can be formed using the existing solution process apparatus. Therefore, the manufacturing costs can be reduced.

In addition, the first, second and third sub-pixels SP1, SP2 and SP3 are connected to the sub-pixels SP1, SP2 and SP3 of the same color along the second direction, and the same color sub-pixels SP1, SP2 and SP3 connected to each other along the second direction include the light-emitting layers connected to each other to form one body. Accordingly, when the light-emitting layers are formed through the solution process, a deviation in the amount of dropping between nozzles is minimized, and thicknesses of the light-emitting layers can be uniform in the respective sub-pixels SP1, SP2 and SP3.

The pixel arrangement according to the fourth embodiment of the present disclosure can be implemented by a bank structure, that is, first and second banks 472 and 474. The bank structure according to the fourth embodiment of the present disclosure will be described with reference to FIGS. 14A and 14B.

Figure 14A:
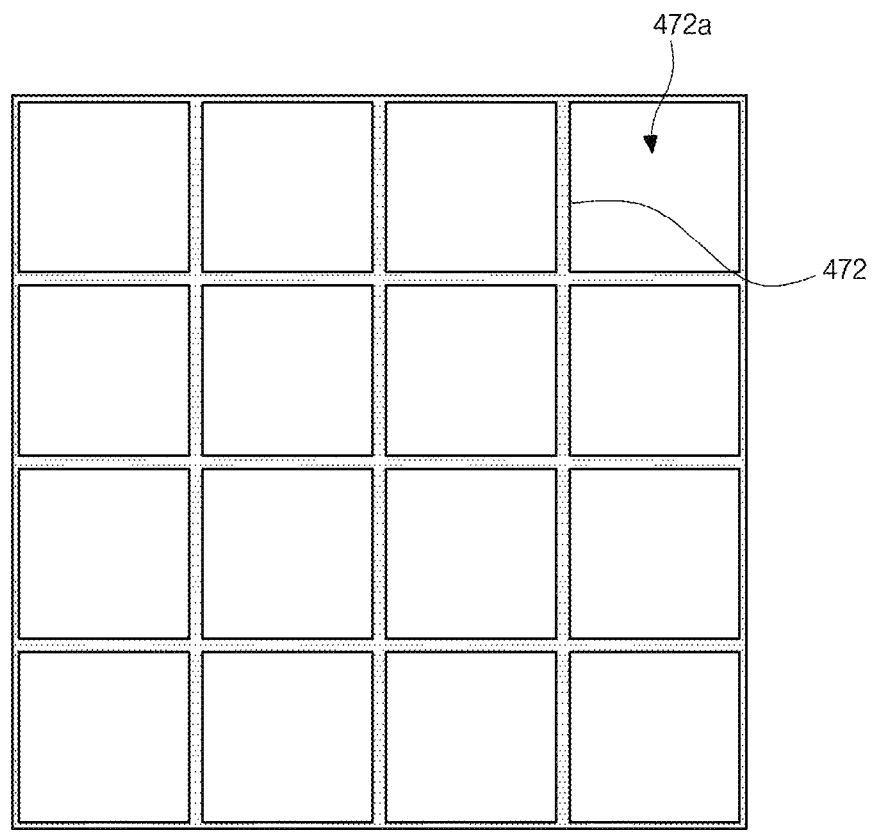
FIG. 14A is a view of schematically illustrating a first bank of the electroluminescent display device according to the fourth embodiment of the present disclosure.
Figure 14B:
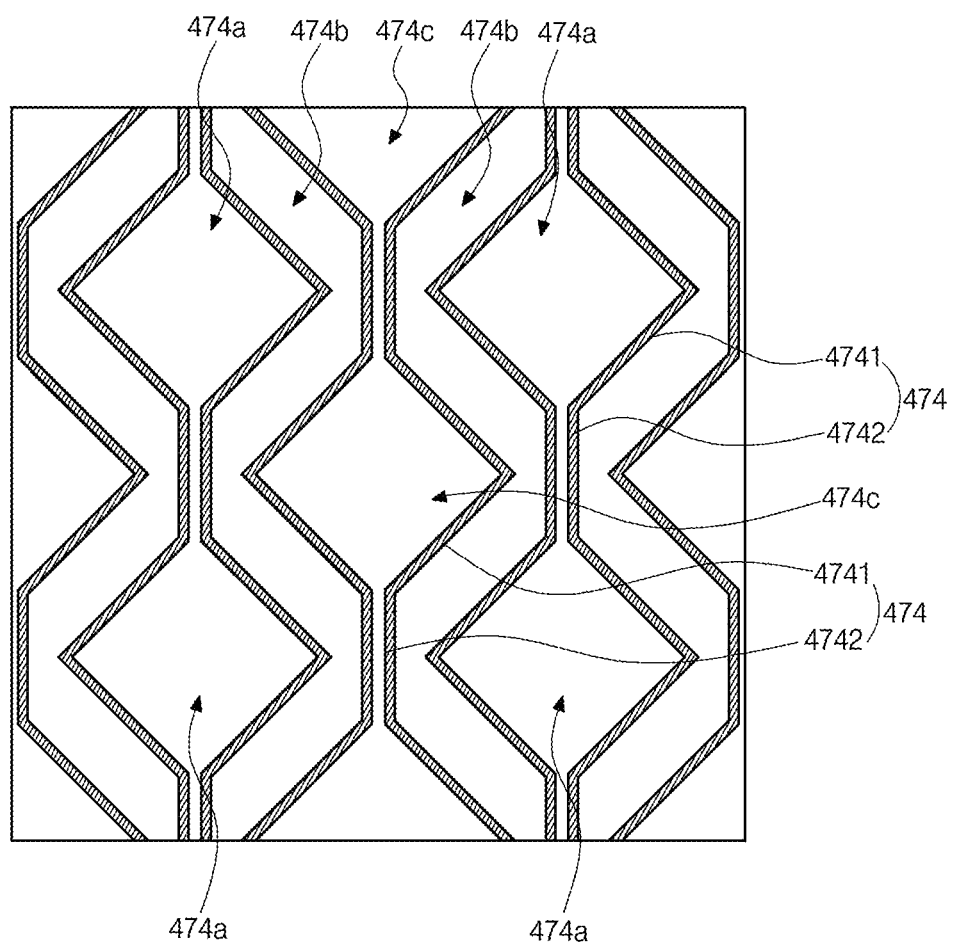
FIG. 14B is a view of schematically illustrating a second bank of the electroluminescent display device according to the fourth embodiment of the present disclosure.

FIG. 14A is a view of schematically illustrating a first bank of the electroluminescent display device according to the fourth embodiment of the present disclosure, and FIG. 14B is a view of schematically illustrating a second bank of the electroluminescent display device according to the fourth embodiment of the present disclosure.

In FIG. 14A, the first bank 472 according to the fourth embodiment of the present disclosure corresponds to a region between adjacent pixels P1, P2, P3 and P4 of FIG. 13, that is, between same color sub-pixels SP1, SP2 and SP3 of FIG. 13 and has a lattice shape along the first and second directions.

The first bank 472 has a hydrophilic property.

In addition, the first bank 472 has a hole 472a corresponding to each of the pixels P1, P2, P3 and P4 of FIG. 13.

Next, as shown in FIG. 14B, the second bank 474 according to the fourth embodiment of the present disclosure includes a first pattern 4741 and a second pattern 4742. The first pattern 4741 of the second bank 474 corresponds to a region between adjacent different color sub-pixels SP1, SP2 and SP3 of FIG. 13 and has a substantially rectangular shape. The second pattern 4742 of the second bank 474 corresponds to a region between the second sub-pixels SP2 of FIG. 13 adjacent to each other along the first direction and connects the first patterns 4741 of the second bank 474 adjacent to each other along the second direction.

The second pattern 4742 of the second bank 474 can partially overlap the first bank 472. The second bank 474 has a hydrophobic property.

In the meantime, the second bank 474 has first, second and third openings 474a, 474b and 474c corresponding to the first, second and third sub-pixels SP1, SP2 and SP3 of FIG. 13, respectively. Namely, the first opening 474a corresponds to the four first sub-pixels SP1 of FIG. 13 adjacent to each other, the third opening 474c corresponds to the four third sub-pixels SP3 of FIG. 13 adjacent to each other, and the second opening 474b corresponds to the second sub-pixels SP2 of FIG. 13 between the first sub-pixels SP1 of FIG. 13 and the third sub-pixels SP3 of FIG. 13. Here, each of the first, second and third openings 474a, 474b and 474c is connected to the corresponding opening along the second direction to form one body. That is, the first openings 474a adjacent to each other along the second direction are connected to each other, the second openings 474b adjacent to each other along the second direction are connected to each other, and the third openings 474c adjacent to each other along the second direction are connected to each other.

Accordingly, in the fourth embodiment of the present disclosure, the four first sub-pixels SP1 of FIG. 13 are arranged adjacent to each other, the four third sub-pixels SP3 of FIG. 13 are arranged adjacent to each other, and the second sub-pixels SP2 of FIG. 13 are disposed between the first and third sub-pixels SP1 and SP3 of FIG. 13 by the first bank 472 and the second bank 474. Further, the same color sub-pixels SP1, SP2 and SP3 of FIG. 13 adjacent to each other along the second direction can be configured to be connected to each other.

In the electroluminescent display device according to the fourth embodiment of the present disclosure, each of the pixels P1, P2, P3 and P4 can have the same planar structure as that of FIG. 5, and each of the sub-pixels SP1, SP2 and SP3 can have the same circuit configuration as that of FIG. 4. Further, each of the sub-pixels SP1, SP2 and SP3 can have substantially the same cross-sectional structure as that of FIG. 10.

In the present disclosure, by forming the light-emitting layer of each sub-pixel through the solution process, a mask is omitted to thereby reduce the manufacturing costs, and a display device with a large size and high definition can be implemented.

In addition, the sub-pixels of the same color are arranged adjacent to each other, and the manufacturing costs can be further reduced by forming the light-emitting layer using the existing solution process apparatus.

Moreover, the same color sub-pixels of adjacent unit pixel groups are connected to each other, and the light-emitting layers of the same color sub-pixels of the adjacent unit pixel groups are formed as one body, thereby minimizing the deviation in the amount of dropping between nozzles and uniformly forming the thicknesses of the light-emitting layers of the sub-pixels. Therefore, the mura is prevented, thereby preventing the image quality of the display device from being lowered.

In various embodiments of the present disclosure, the first bank and the second bank need not be straight or in a line form. For example, the first bank and the second bank can be curved, wavy, zigzag, have protrusions and/or indentations, and can have varying thicknesses. Also, the first bank and the second bank may enclose different areas, so that the sub-pixels SP1, SP2 and SP3 may have different shapes, such as an oval shape, circular shape, star shape, or other geometric shapes. Also, the different areas of the subpixels SP1, SP2 and SP3 may have nested shapes, such that within a sub-pixel of one shape can be another enclosed area of the same or different shape.

In various embodiments, the first bank can have a first height, and the second bank can have a second height. Also, the first height can be smaller than the second height. Additionally, the first bank can define same color sub-pixels of different pixels, and the second bank can define different color sub-pixels of the same pixel. The first bank and the second bank can have various cross sectional shapes other than a rectangular shape. For example, the first bank and the second bank can have cross sectional shapes such as a semicircular shape, triangular shape, a rhombus shape, an undercut shape, a t-shaped cross section, and others. Although the sub-pixels SP1, SP2 and SP3 are associated with red, blue and green colors, respectively, such is not required, and sub-pixels SP1, SP2 and SP3 may have various colors.

It will be apparent to those skilled in the art that various modifications and variations can be made in a display device of the present disclosure without departing from the sprit or scope of the embodiments. Thus, it is intended that the present disclosure covers the modifications and variations of this invention provided they come within the scope of the appended claims and their equivalents.

What is claimed is:

1. An electroluminescent display device comprising:
a plurality of unit pixel groups, each unit pixel group having first, second, third and fourth pixels arranged in a matrix form along a first direction and a second direction, each of the first, second, third and fourth pixels including first, second and third sub-pixels of different colors,
wherein, in each of the first, second, third and fourth pixels, the second sub-pixel is disposed between the first sub-pixel and the third sub-pixel along a third direction or a fourth direction crossing the first and second directions, and
wherein the second sub-pixels of the first, second, third and fourth pixels surround the first sub-pixels of the first, second, third and fourth pixels;
a light-emitting diode disposed at each of the first, second and third sub-pixels and including a first electrode, a light-emitting layer and a second electrode; and
a first bank disposed between adjacent sub-pixels of a same color along the first direction and between adjacent sub-pixels of a same color along the second direction, and a second bank disposed on the first bank,
wherein the second bank includes first patterns between adjacent sub-pixels of different colors along the third direction and between adjacent sub-pixels of different colors along the fourth direction, and second patterns between the second sub-pixels adjacent to each other along the first direction, and wherein the first patterns and the second patterns adjacent along the second direction are connected to each other, and the first patterns and the second patterns adjacent along the first direction are separated from each other.

2. The electroluminescent display device of claim 1, wherein in each of the first, second and third sub-pixels, a thickness of a portion of the light-emitting layer over only the first electrode is different from a thickness of an edge portion of the light-emitting layer adjacent the second bank.

3. The electroluminescent display device of claim 1, wherein the first bank has a hydrophilic property and the second bank has a hydrophobic property.

4. The electroluminescent display device of claim 1, wherein light-emitting layers disposed at the adjacent sub-pixels of the same color along the second direction are connected to each other on the first bank to form one body.

5. The electroluminescent display device of claim 1, wherein the first bank is further disposed between the adjacent sub-pixels of the different colors along the third direction and between the adjacent sub-pixels of the different colors along the fourth direction.

6. The electroluminescent display device of claim 5, wherein the second bank overlaps the first bank between the adjacent sub-pixels of the different colors along the third direction and between the adjacent sub-pixels of the different colors along the fourth direction.

7. The electroluminescent display device of claim 6, wherein a width of the second bank is smaller than a width of the first bank between the adjacent sub-pixels of the different colors along the third direction and between the adjacent sub-pixels of the different colors along the fourth direction.

8. The electroluminescent display device of claim 1, wherein the second bank has first, second and third openings corresponding to the first, second and third sub-pixels, respectively.

9. The electroluminescent display device of claim 8, wherein the first opening corresponding to the first sub-pixels of the first, second, third and fourth pixels of one unit pixel group is connected to another first opening corresponding to first sub-pixels of first, second, third and fourth pixels of another unit pixel group adjacent to the one unit pixel group along the second direction.

10. The electroluminescent display device of claim 1, wherein light-emitting layers at the first sub-pixels of the first, second, third and fourth pixels of one unit pixel group are connected to each other.

11. The electroluminescent display device of claim 10, wherein the light-emitting layers at the first sub-pixels of the first, second, third and fourth pixels of one unit pixel group are connected to light-emitting layers at first sub-pixels of first, second, third and fourth pixels of another unit pixel group adjacent to the one unit pixel group along the second direction.

* * * * *